US012080800B2

(12) United States Patent
Lai et al.

(10) Patent No.: US 12,080,800 B2
(45) Date of Patent: Sep. 3, 2024

(54) SEMICONDUCTOR DEVICES WITH MODIFIED SOURCE/DRAIN FEATURE AND METHODS THEREOF

(71) Applicant: Taiwan Semiconductor Manufacturing Company, Ltd., Hsin-Chu (TW)

(72) Inventors: Wei-Jen Lai, Keelung (TW); Wei-Yang Lee, Taipei (TW); De-Fang Chen, Hsinchu (TW); Ting-Wen Shih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 382 days.

(21) Appl. No.: 17/464,500

(22) Filed: Sep. 1, 2021

(65) Prior Publication Data
US 2022/0285561 A1    Sep. 8, 2022

Related U.S. Application Data

(60) Provisional application No. 63/157,255, filed on Mar. 5, 2021.

(51) Int. Cl.
| | | |
|---|---|---|
| *H01L 29/00* | (2006.01) |
| *H01L 21/02* | (2006.01) |
| *H01L 29/06* | (2006.01) |
| *H01L 29/40* | (2006.01) |
| *H01L 29/417* | (2006.01) |
| *H01L 29/423* | (2006.01) |
| *H01L 29/66* | (2006.01) |
| *H01L 29/786* | (2006.01) |

(52) U.S. Cl.
CPC .. *H01L 29/78618* (2013.01); *H01L 21/02252* (2013.01); *H01L 21/0259* (2013.01); *H01L 29/0665* (2013.01); *H01L 29/401* (2013.01); *H01L 29/41733* (2013.01); *H01L 29/42392* (2013.01); *H01L 29/66545* (2013.01); *H01L 29/66553* (2013.01); *H01L 29/66742* (2013.01); *H01L 29/78696* (2013.01)

(58) Field of Classification Search
CPC ............. H01L 29/0655; H01L 29/0669; H01L 29/0673; H01L 29/41733; H01L 29/42392
See application file for complete search history.

(56) References Cited

U.S. PATENT DOCUMENTS

2020/0295002 A1* 9/2020 Snyder .............. H01L 29/78696
2020/0395446 A1* 12/2020 Yi ....................... H01L 29/0673

FOREIGN PATENT DOCUMENTS

TW        202038332 A    10/2020

* cited by examiner

*Primary Examiner* — Reema Patel
(74) *Attorney, Agent, or Firm* — HAYNES AND BOONE, LLP

(57) ABSTRACT

A method includes providing a semiconductor structure including a fin protruding from a substrate, where the fin includes first semiconductor layers and second semiconductor layers, recessing the fin to form a source/drain (S/D) recess, forming an S/D feature in the S/D recess, trimming the S/D feature, depositing a dielectric layer to cover the S/D feature, forming a contact hole in the dielectric layer to expose the S/D feature, and forming a metal contact in the contact hole.

20 Claims, 36 Drawing Sheets

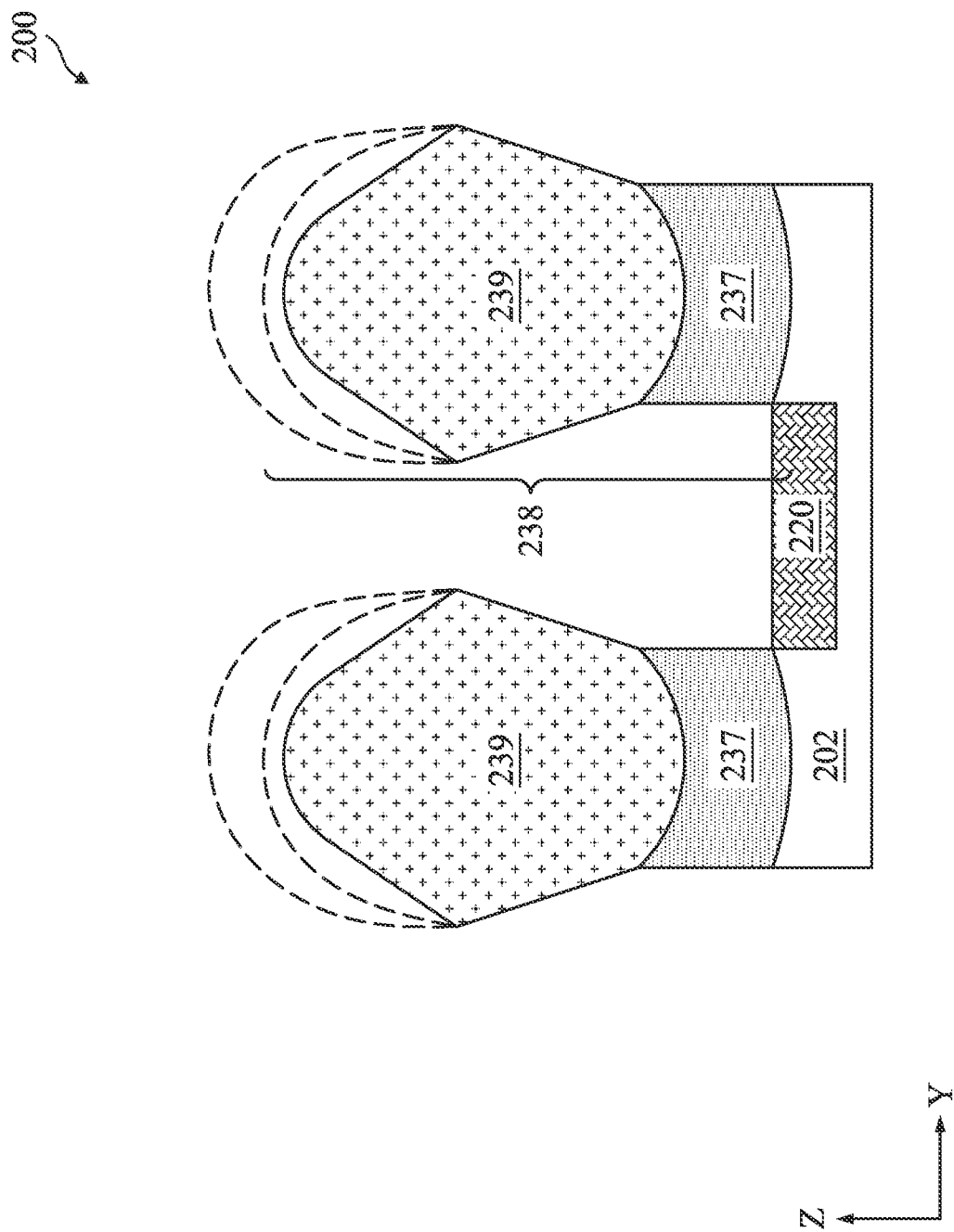

SEMICONDUCTOR DEVICES WITH MODIFIED SOURCE/DRAIN FEATURE AND METHODS THEREOF

PRIORITY

This application claims priority to U.S. Provisional Patent Application Ser. No. 63/157,255 filed on Mar. 5, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

Recently, multi-gate transistors have been introduced in an effort to improve gate control by increasing gate-channel coupling, reduce OFF-state current, and reduce short-channel effects (SCEs). One such multi-gate transistor that has been introduced is the fin field-effect transistor (FinFET). The FinFET gets its name from the fin-like structure which extends from a substrate on which it is formed, and which is used to form the FET channel. A further type of multi-gate transistor, introduced in part to address performance challenges associated with some configurations of FinFETs, is the gate-all-around (GAA) transistor. The GAA device gets its name from the gate structure which extends completely around the channel region, providing access to the channel on four sides. The GAA devices are compatible with conventional complementary metal-oxide-semiconductor (CMOS) processes and their structure allows them to be aggressively scaled while maintaining gate control and mitigating SCEs. In general, The GAA devices may be implemented, for example, in cases where FinFETs can no longer meet performance requirements. However, GAA device fabrication can be challenging, and current methods continue to face challenges with respect to both device fabrication and performance. For example, high parasitic capacitance may lead to lower device speed (e.g., RC delays) when separation distances between the active device regions are reduced to meet design requirements of smaller technology nodes. While methods of reducing parasitic capacitance in IC devices have been generally adequate for their intended purposes, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4B, 5B, 6B, 7B, 8B, 9B, 10B, 11B, 12B, 18B, 19B, and 20B illustrate cross-sectional views of the semiconductor device taken along line BB' as shown in FIGS. 2A and/or 2B during intermediate stages of the method shown in FIGS. 1A, 1B and/or 1C according to one or more aspects of the present disclosure.

DETAILED DESCRIPTION

Figure 1A:
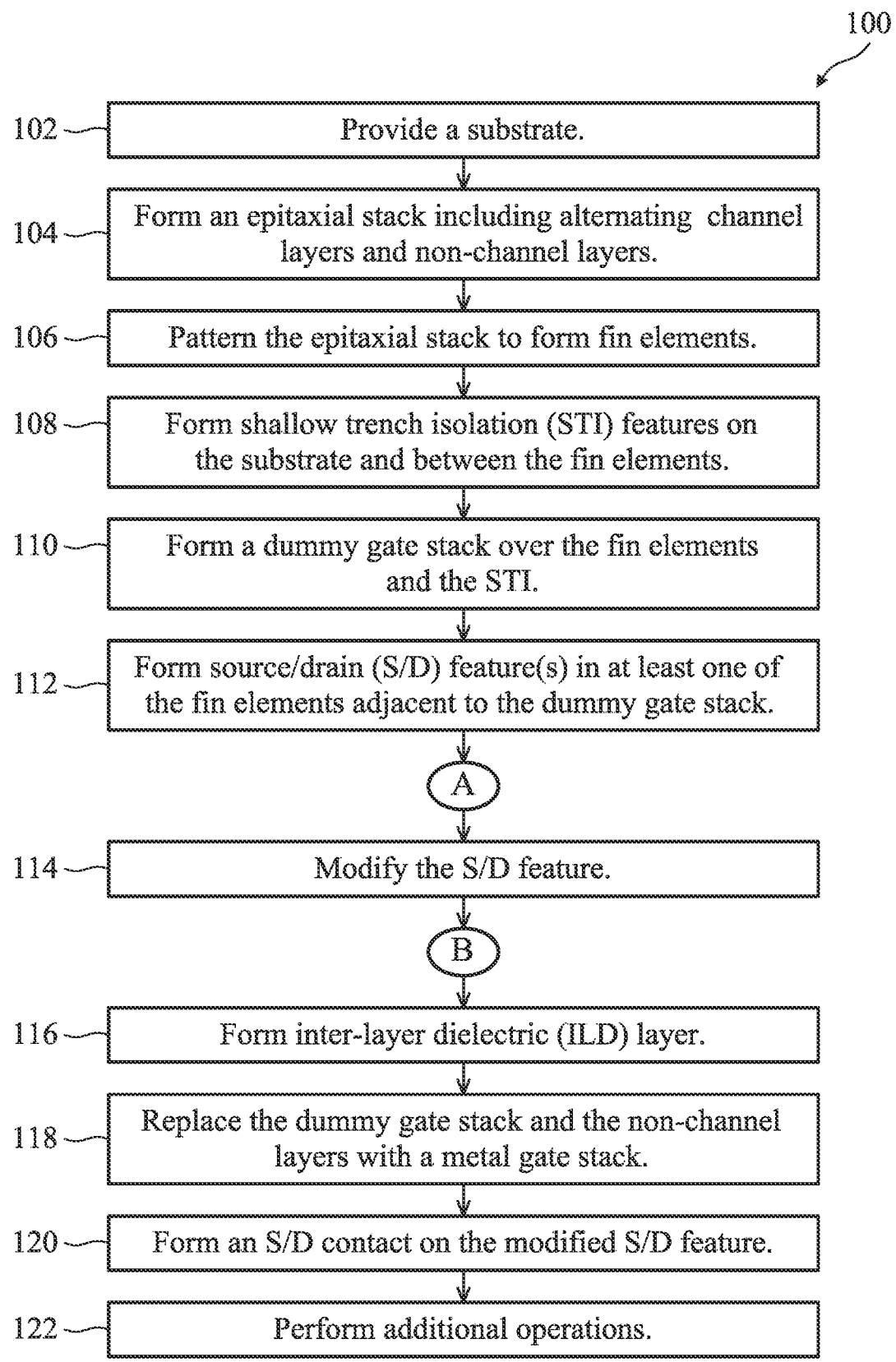
FIGS. 1A, 1B and 1C illustrate flowcharts of a method for forming a semiconductor device including modified source/drain (S/D) features, according to one or more aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices and fabrication methods, and more particularly to field-effect transistors (FETs), such as three-dimensional gate-all-around (GAA) FET (alternatively referred to as nanostructure, or NS FETs), in memory and/or standard logic cells of an integrated circuit (IC) structure. Generally, a GAA FET includes a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications. GAA FETs have demonstrated attractive qualities over single-gate devices in terms of control over short-channel effects (SCEs) and driving ability. However, in some instances, GAA FETs may suffer parasitic capacitances existing between its dielectric components disposed between active regions. While many design choices have been utilized to reduce the parasitic capacitance, they are not entirely satisfactory in all aspects. In this regard, improvements in methods of forming GAA FETs with reduced parasitic capacitance are desired. The present embodiments are directed to methods of modifying a source/drain (S/D) feature to reduce the parasitic capacitance between the S/D feature and adjacent components without compromising other aspects of the design requirements, such as resistance. The present disclosure includes multiple embodiments. Different embodiments may have different advantages, and no particular advantage is necessarily required of any embodiment. The following disclosure will continue with one or more GAA FETs as example multi-gate transistors to illustrate various embodiments of the present disclosure. It is understood, however, that the application should not be limited to a particular type of device and may be applicable to other multi-gate transistors, such as FinFETs.

Figure 1B:
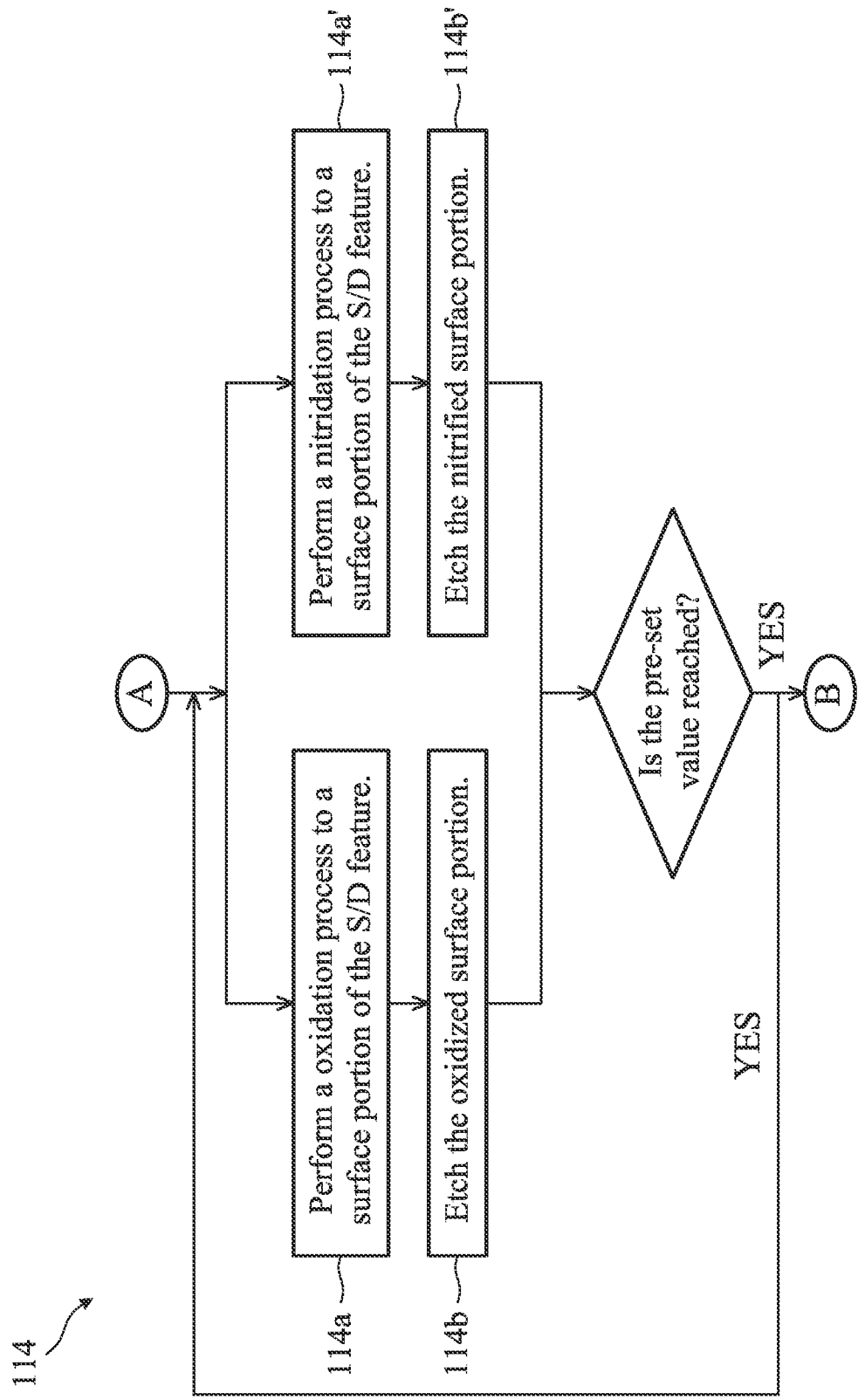
Figure 1C:
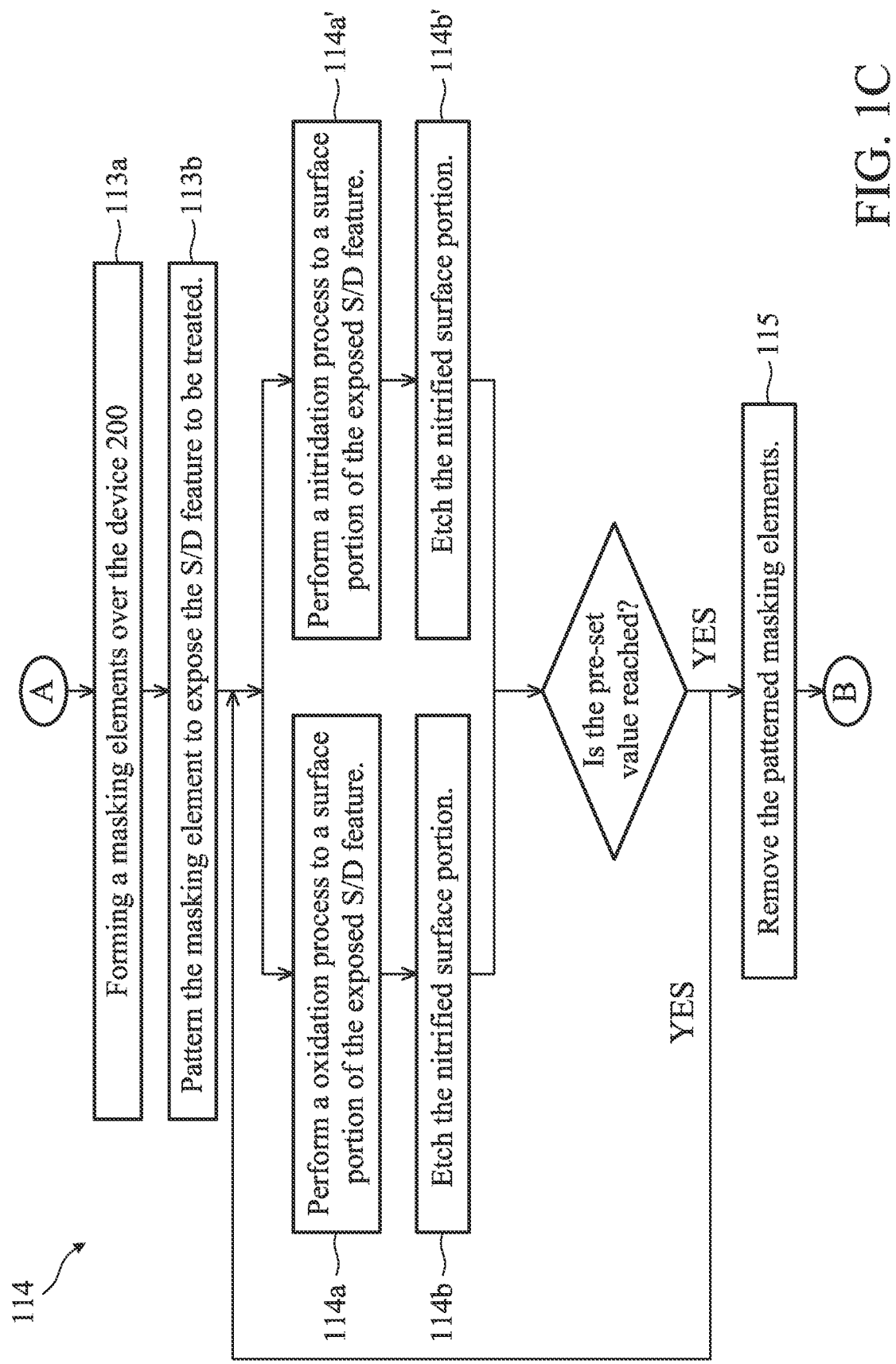
Figure 2B:
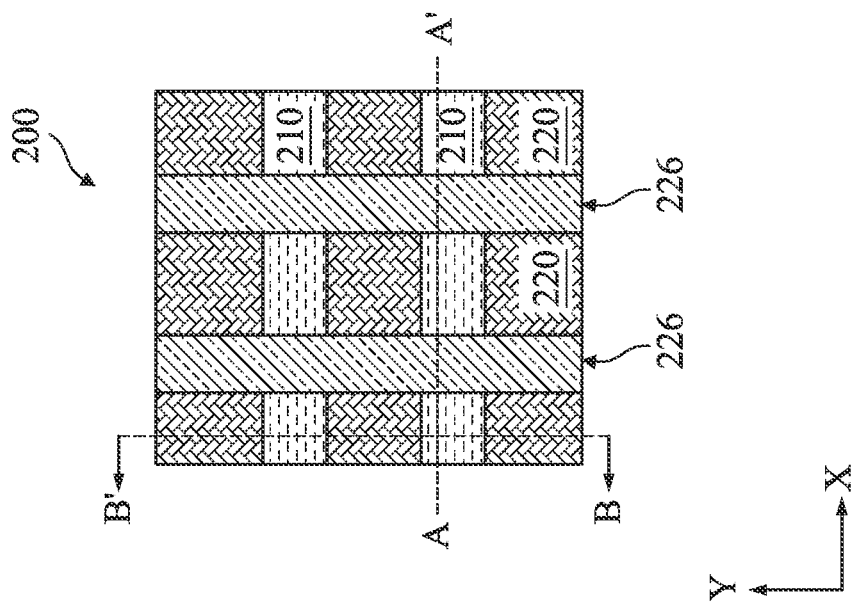
FIG. 2B illustrates a planar top view of the semiconductor device shown in FIG. 2A according to one or more aspects of the present disclosure.
Figure 2A:
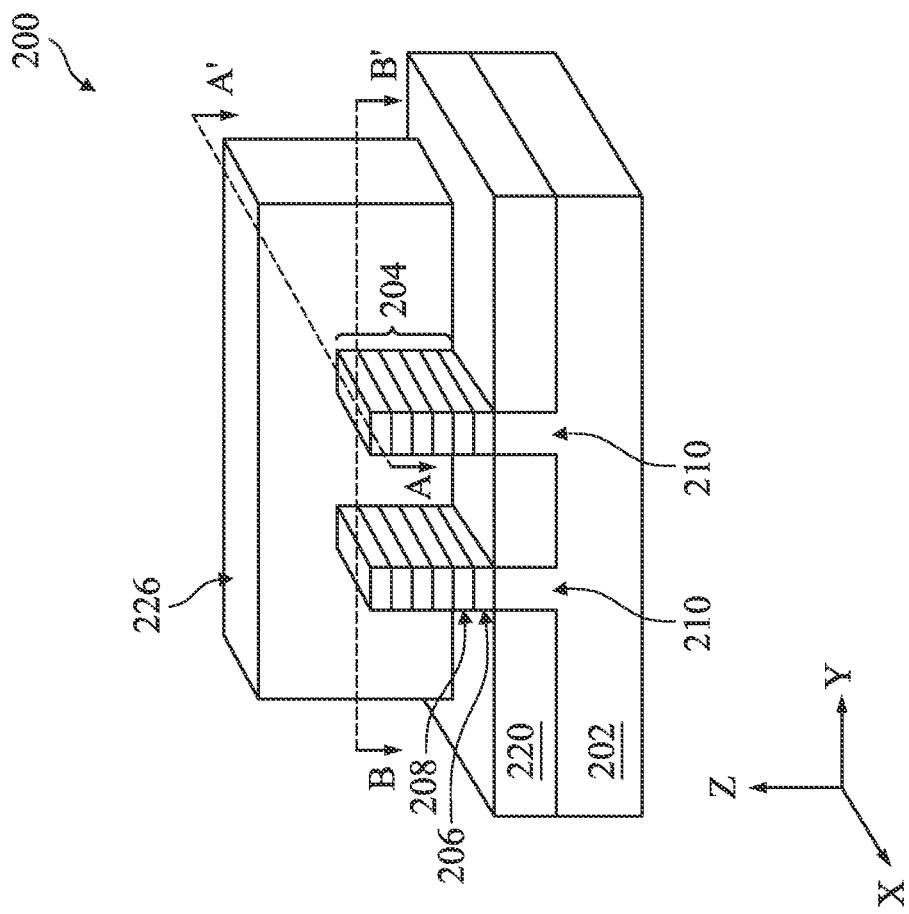
FIG. 2A illustrates a three-dimensional perspective view of a portion of an example semiconductor device according to one or more aspects of the present disclosure.
Figure 3:
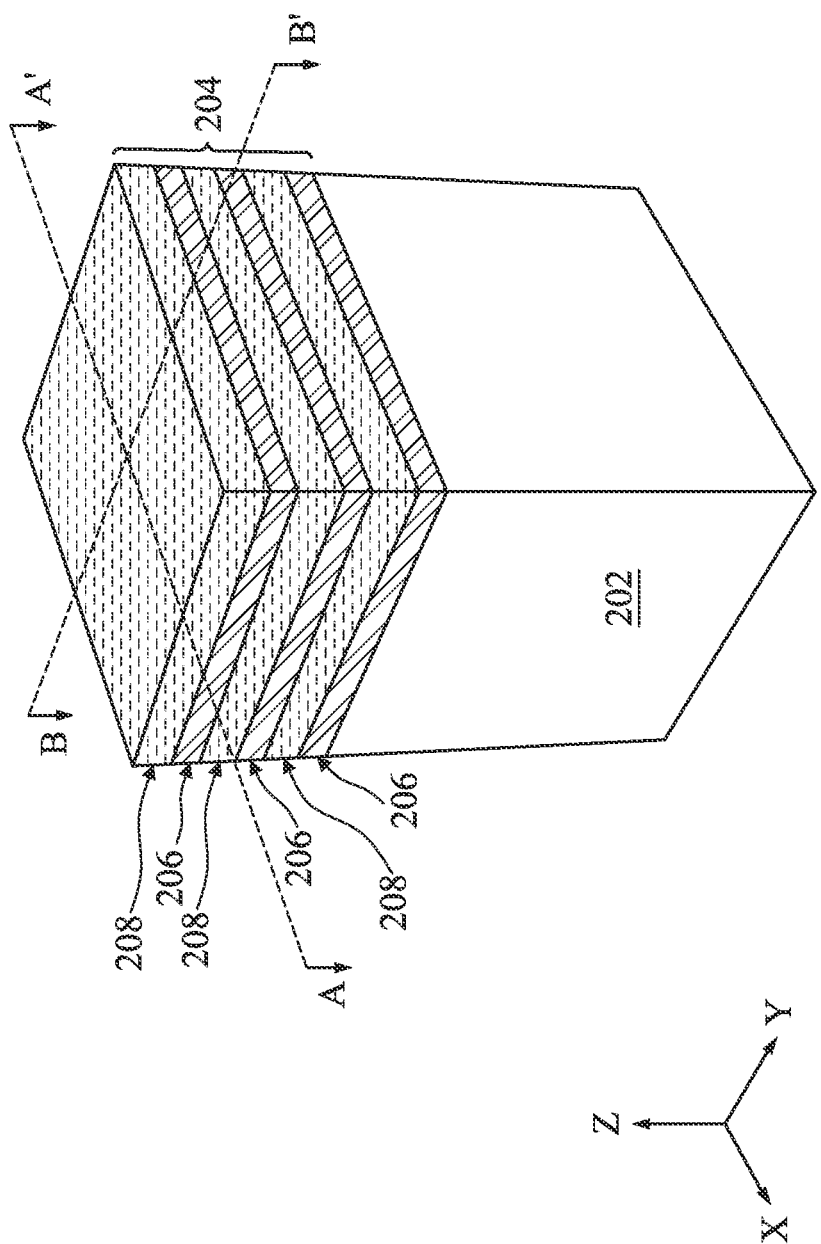
FIG. 3 illustrates a three-dimensional perspective view of the semiconductor device during an intermediate stage of the method shown in FIGS. 1A, 1B, and/or 1C according to one or more aspects of the present disclosure.

Referring now to FIGS. 1A 1B, and 1C collectively, a flowchart of a method 100 of forming a semiconductor device 200 (hereafter simply referred to as the device 200) is illustrated according to various aspects of the present disclosure. Methods 100 is merely an example and are not intended to limit the present disclosure beyond what is explicitly recited in the claims. Additional operations can be provided before, during, and after methods 100, and some operations described can be replaced, eliminated, or moved around for additional embodiments of the method. Methods 100 is described below in conjunction with FIGS. 3-20D, which are various cross-sectional views of the device 200 as shown in FIGS. 2A, 2B and 3 at intermediate steps of the method 100. For examples, FIGS. 4A, 5A, 6A, 7A, 8A, 9A, 10A, 11A, 12A, 12C, 12D, 18A, 19A, 20A, 20C, and 20D are cross-sectional views of the device 200 taken along line AA' as shown in FIGS. 2A 2B, and/or 3, which are cuts along a lengthwise direction of a channel region; FIGS. 4B, 5B, 6B, 7B, 8B, 9B, 10B, 11B, 12B, 18B, 19B, and 20B are cross-sectional views of the device 200 taken along line BB' as shown in FIGS. 2A, 2B and/or 3, which are cuts in a source/drain region perpendicular to the lengthwise direction of the channel region.

The device 200 may be an intermediate device fabricated during processing of an IC, or a portion thereof, that may comprise static random-access memory (SRAM) and/or other logic circuits, passive components such as resistors, capacitors, and inductors, and active components such as GAA FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the device 200 includes one or more GAA FETs. The present disclosure is not limited to any particular number of devices or device regions, or to any particular device configurations. Additional features can be added to the device 200, and some of the features described below can be replaced, modified, or eliminated in other embodiments of the device 200.

Referring to FIGS. 1A and 3, at operation 102, the method 100 provides (or is provided with) a semiconductor substrate (hereafter referred to as the substrate) 202. The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing.

In some embodiments where the substrate 202 includes FETs, various doped regions, such as source/drain regions, are disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIGS. 1A and 3, the method 100 forms an epitaxial stack 204 at step 104 including alternately stacked epitaxial layer 208 and epitaxial layer 206. Each epitaxial layer 208 and epitaxial layer 206 may include a semiconductor material such as, for example, Si, Ge, SiC, SiGe, GeSn, SiGeSn, SiGeCSn, other suitable semiconductor materials, or combinations thereof, while each epitaxial layer 206 has a composition different from that of the epitaxial layer 208. In one such example, the epitaxial layers 208 may include elemental Si and the epitaxial layers 206 may include elemental Ge. In the present embodiments, the epitaxial layers 208 includes elemental Si and the epitaxial layers 206 include SiGe. In some examples, the epitaxial stack 204 may include a total of two to ten pairs of alternating epitaxial layers 208 and epitaxial layers 206; of course, other configurations may also be applicable depending upon specific design requirements.

In some embodiments, each of the epitaxial layer 206 has a thickness ranging from about 2 nanometers (nm) to about 6 nm, such as 3 nm in a specific example. Each of the epitaxial layers 206 may be substantially uniform in thickness. In some embodiments, each of the epitaxial layers 208 has a thickness ranging from about 6 nm to about 12 nm, such as 9 nm in a specific example. In some embodiments, each of the epitaxial layers 208 of the stack are substantially uniform in thickness. As described in more detail below, the epitaxial layers 208 may serve as channel region(s) for a subsequently-formed multi-gate device and the thickness is chosen based on device performance considerations. The epitaxial layers 206 in channel regions(s) may eventually be removed and serve to define a vertical distance between adjacent channel region(s) for a subsequently-formed multi-gate device and the thickness is chosen based on device performance considerations. Accordingly, the epitaxial layers 206 may also be referred to as non-channel layer (or sacrificial layers) 206, and epitaxial layers 208 may also be referred to as channel layers 208.

By way of example, epitaxial growth of the layers of the epitaxial stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 208 include the same material as the substrate 202. In some embodiments, the epitaxially grown layers 206 and 208 include a different material than the substrate 202. As stated above, in at least some examples, the epitaxial layers 206 include an epitaxially grown silicon germanium (SiGe) layer and the epitaxial layers 208 include an epitaxially grown silicon (Si) layer. Alternatively, in some embodiments, either of the epitaxial layers 206 and 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206 and 208 may be chosen based on providing differing oxidation, etching selectivity properties. In some embodiments, the epitaxial layers 206 and 208 are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

Figure 4A:
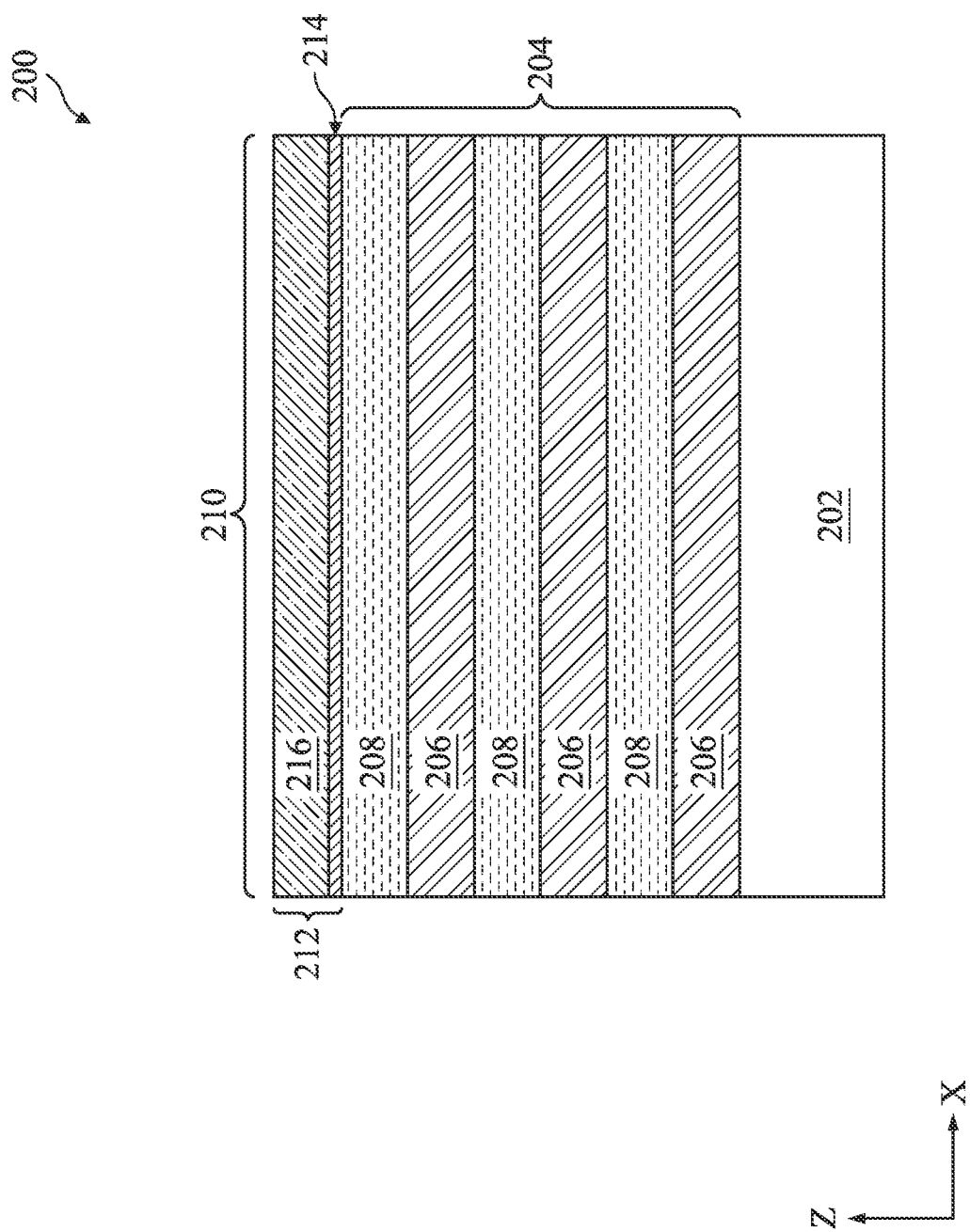
FIGS. 4A, 5A, 6A, 7A, 8A, 9A, 10A, 11A, 12A, 12C, 12D, 13, 14, 15, 16, 17, 18A, 19A, 20A, 20C and 20D illustrate cross-sectional views of the semiconductor device taken along line AA' as shown in FIGS. 2A and/or 2B during intermediate stages of the method shown in FIGS. 1A, 1B, and/or 1C according to one or more aspects of the present disclosure.
Figure 4B:
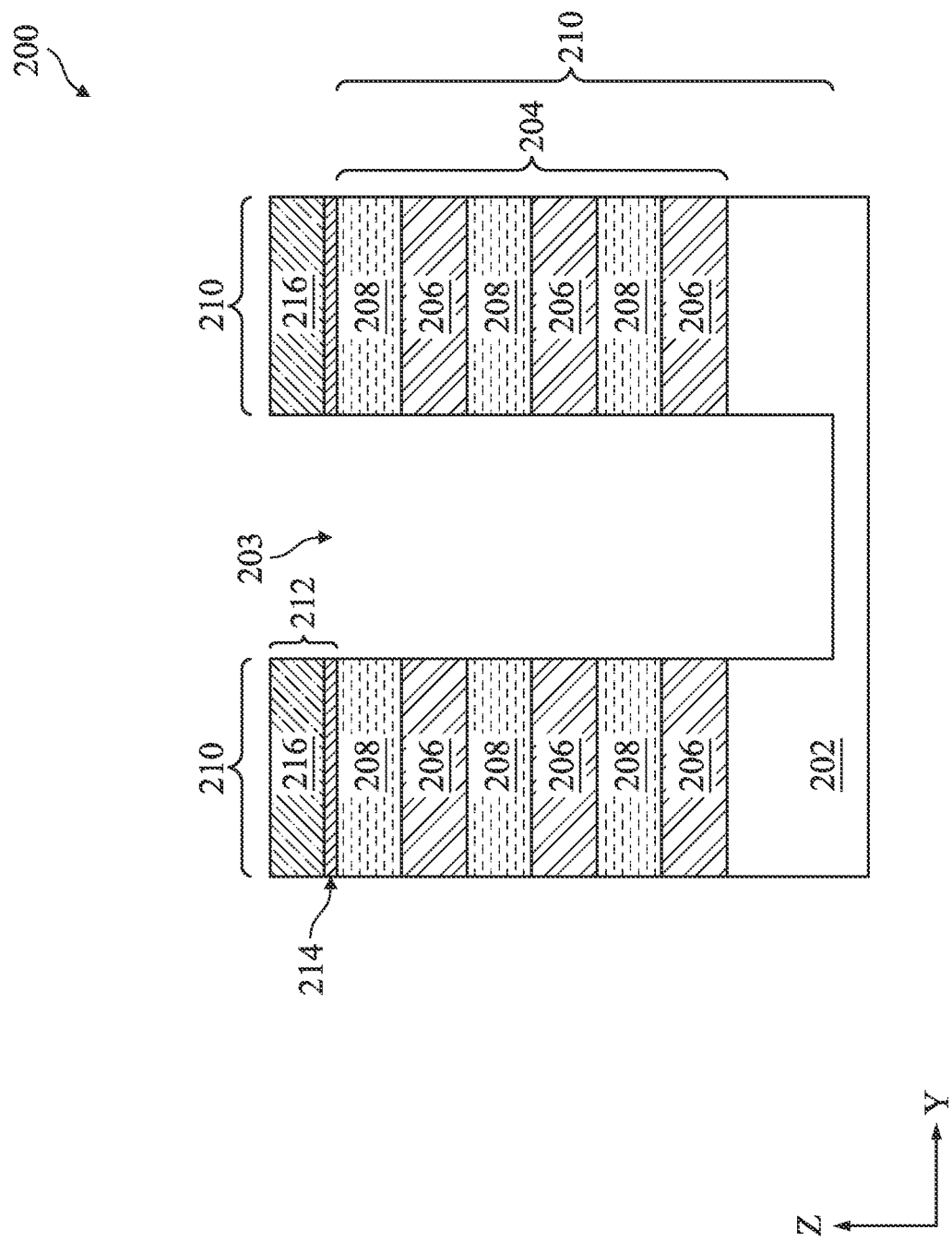

Referring to FIGS. 1A, 4A, and 4B, the method 100 patterns the epitaxial stack 204 to form fin elements (hereafter referred to as the fins hereafter) 210 using a series of photolithography and etching processes. For example, the photolithography process may include forming a photoresist layer overlying the epitaxial stack 204, exposing the photoresist layer to a pattern, performing post-exposure bake processes, and developing the exposed photoresist layer to form a patterned masking element (not depicted). The epitaxial stack 204 is then etched using the patterned masking element as an etching mask, thereby leaving the fins 210 protruding from the substrate 202 and separated by trenches 203. The etching process may include dry etching, wet etching, reactive ion etching (RIE), other suitable processes, or combinations thereof. The patterned masking element is subsequently removed from the epitaxial stack 204 using any suitable process, such as ashing and/or resist stripping.

In some embodiments, the fins 210 may be fabricated by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to form the fins 210 by etching the epitaxial stack 204.

In some embodiments, a hard mask layer 212 is formed over the epitaxial stack 204 prior to patterning the fins 210. In some embodiments, the hard mask layer 212 includes a nitride layer deposited by CVD and/or other suitable technique. In some embodiments, the hard mask layer 212 includes thermally grown oxide, chemical vapor deposition (CVD)-deposited oxide, and/or atomic layer deposition (ALD)-deposited oxide. In some embodiments, the hard mask layer 212 includes an oxide layer 214 (e.g., a pad oxide layer that may include $SiO_2$) and a nitride layer 216 (e.g., a pad nitride layer that may include $Si_3N_4$) formed over the oxide layer 214. The oxide layer 214 may act as an adhesion layer between the epitaxial stack 204 and the nitride layer 216 and may act as an etch stop layer for etching the nitride layer 216.

Numerous other embodiments of methods to form the fins on the substrate may also be used including, for example, defining the fin region (e.g., by mask or isolation regions) and epitaxially growing the epitaxial stack 204 in the form of the fin 210. In some embodiments, forming the fins 210 may include a trimming process to decrease the width of the fins 210. The trimming process may include wet and/or dry etching processes.

Figure 5A:
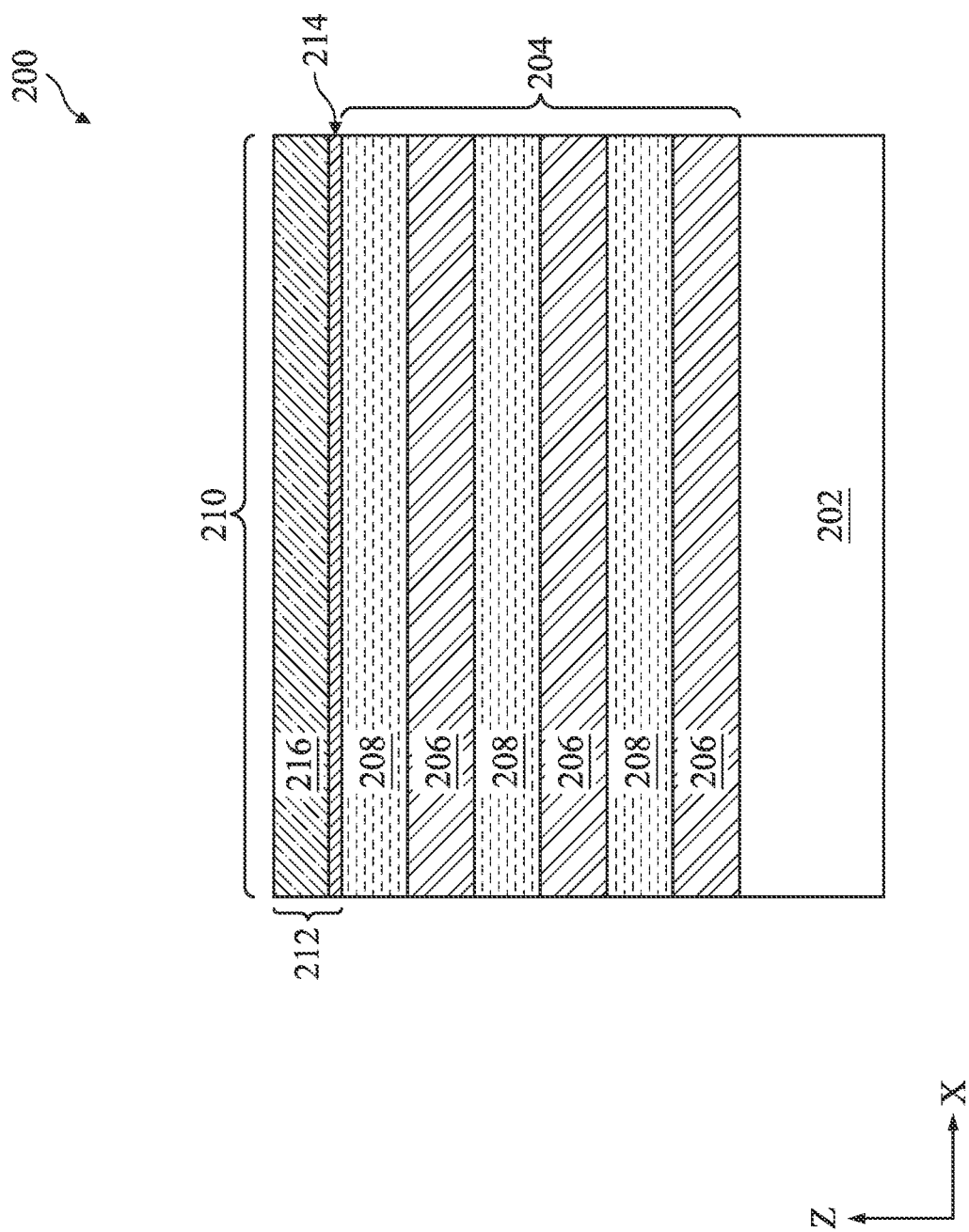
Figure 5B:
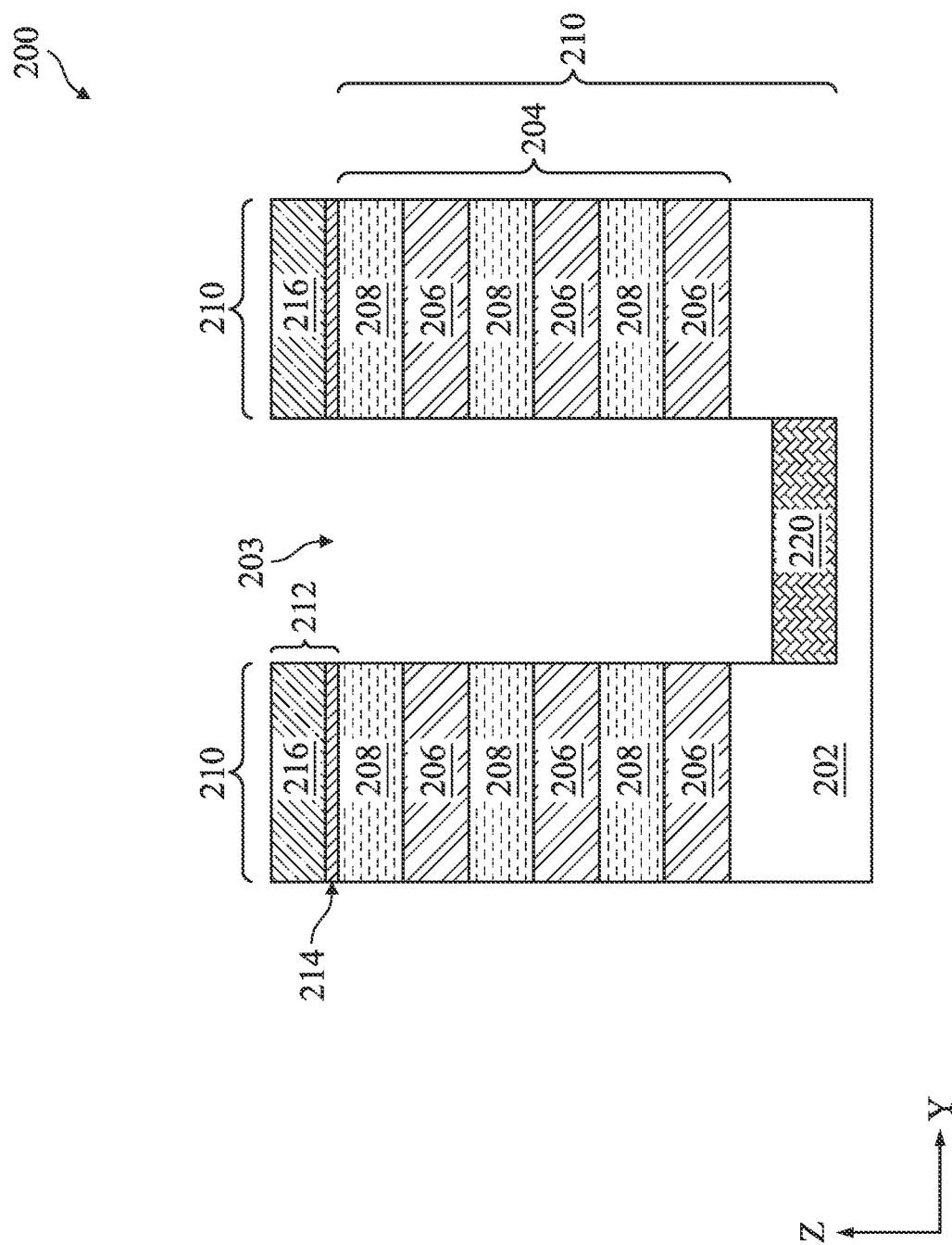

Referring to FIGS. 1A, 5A, and 5B, the method 100 proceeds to step 108 by forming shallow trench isolation (STI) features 220 interposing the fins 210. In some embodiments, a dielectric layer is first deposited over the substrate 202, thereby filling the trenches 203. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the device 200 may be annealed, for example, to improve the quality of the dielectric layer. In some embodiments, the dielectric layer (and subsequently formed STI features 220) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the hard mask layer 212 functions as a CMP stop layer. Referring to the example of FIG. 5B, the STI features 220 interposing between the fins 210 are subsequently recessed to expose the fins 210. In some embodiments, the recessing process may include a dry etching process, a wet etching process, and/or a combination thereof. The hard mask layer 212 may be removed before, during, and/or after the recessing of the STI features 220. The hard mask layer 212 may be removed, for example, by a wet etching process using $H_3PO_4$ or other suitable etchants. In some embodiments, the hard mask layer 212 is removed by the same etchant used to recess the STI features 220. In some embodiments, a recessing depth is controlled (e.g., by controlling an etching time) to adjust a height of the exposed fins 210. In the illustrated embodiment, the height is adjusted to expose all of the layers of the epitaxial stack 204.

Figure 6A:
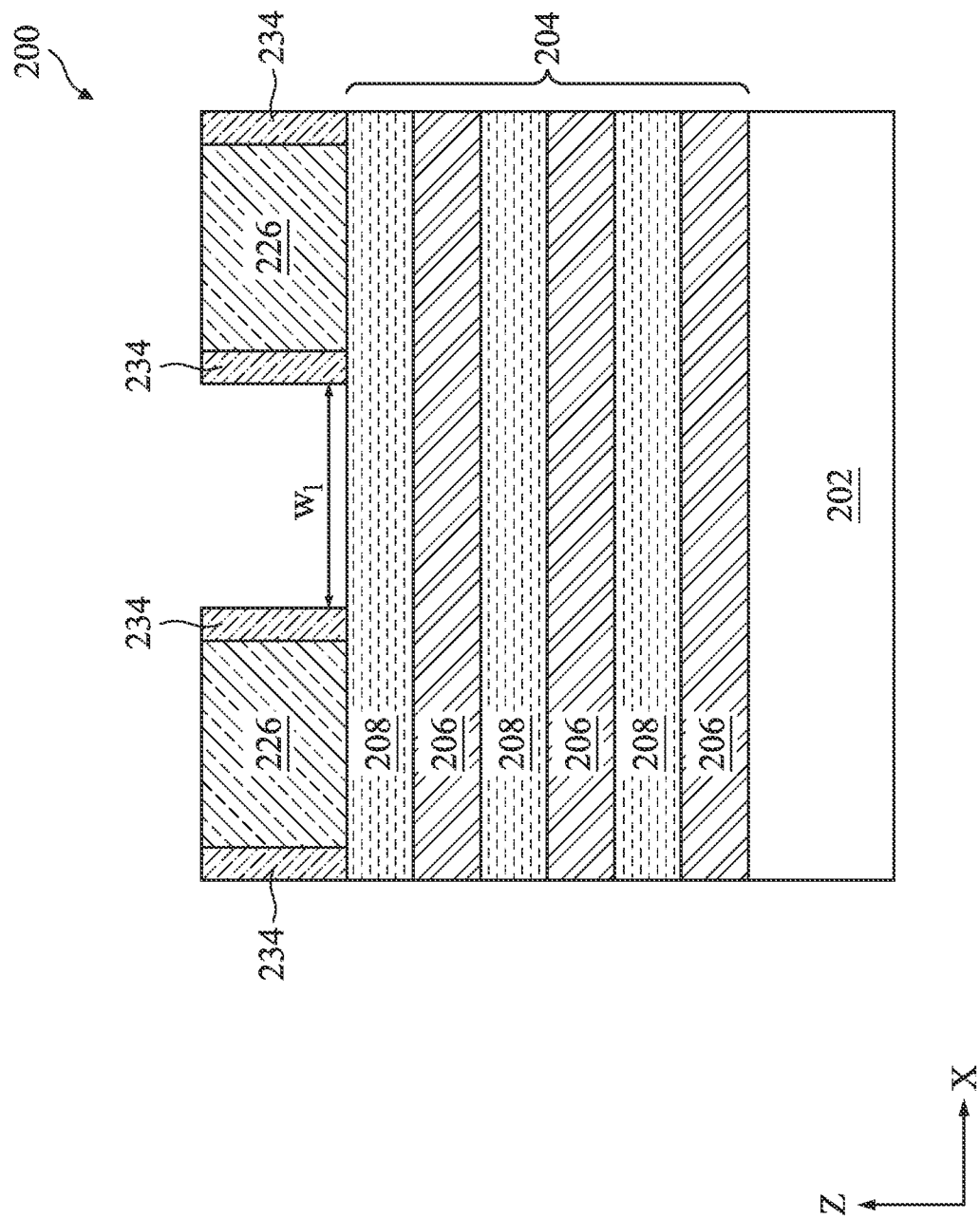
Figure 6B:
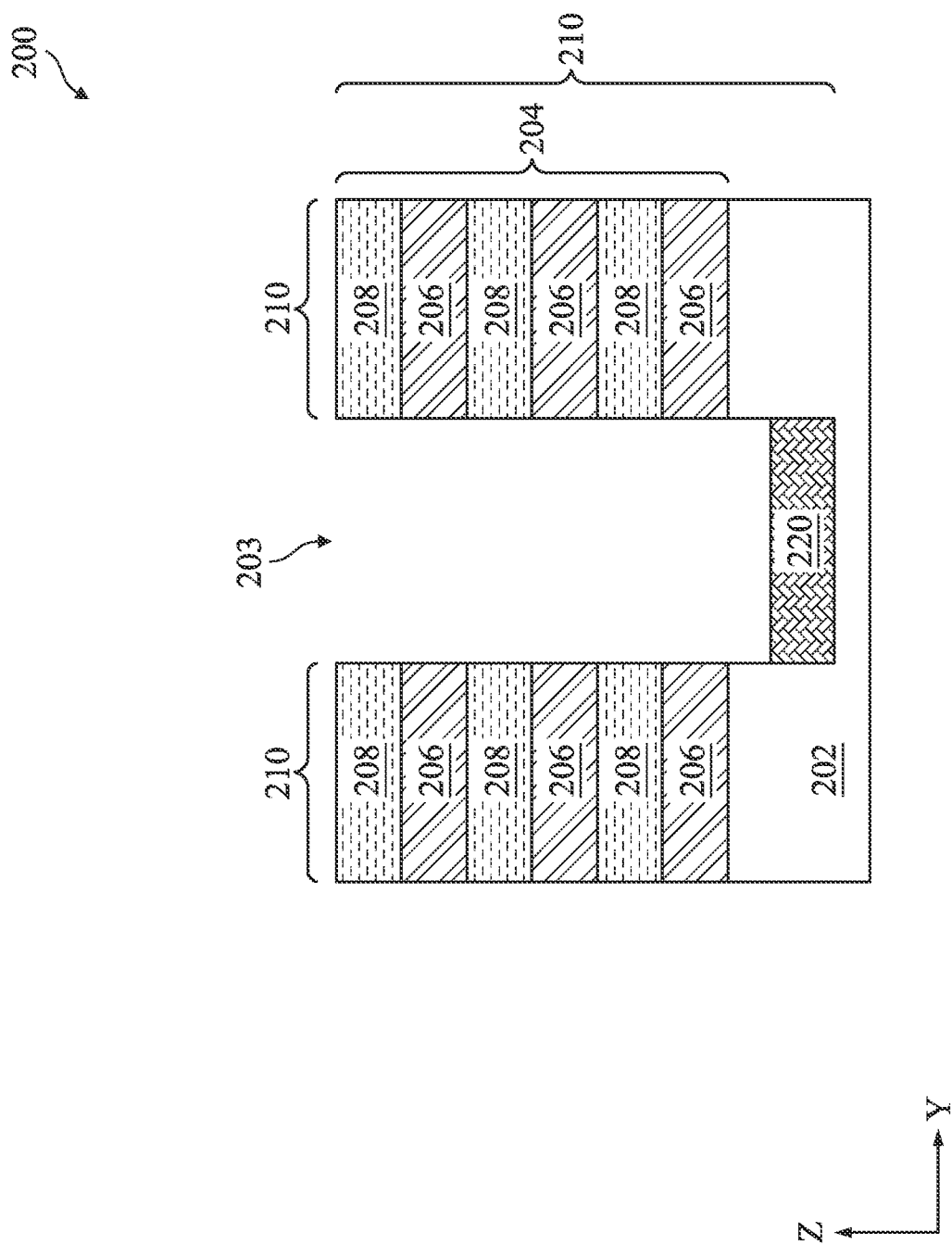

Referring to FIGS. 1, 6A, and 6B, the method 100 forms one or more dummy gate stacks (or replacement gate stacks) 226 over the fins 210 at operation 110. Each of the dummy gate stacks 226 may include a dummy gate electrode (not depicted separately) disposed over an optional dummy gate dielectric layer and/or an interfacial layer (not depicted). The dummy gate stacks 226 may be formed by a series of deposition and patterning processes. For example, the dummy gate stacks 226 may be formed by depositing a polysilicon (poly-Si) layer over the substrate 202, and subsequently patterning the poly-Si layer via a series of photolithography and etching processes. To accommodate the patterning process and protect the dummy gate stacks 226 during subsequent fabrication processes, a hard mask layer (not depicted) may be formed over the dummy gate stacks 226. In some embodiments, the dummy gate stacks 226 is subsequently replaced by metal gate stacks. A region of the fins 210 underlying the dummy gate stack 226 is referred to as the channel region, while a region of the fins 210 between the dummy gate stacks 226 are referred to as S/D region. The portion of the fins 210 in the S/D region is later recesses to form an opening for the S/D features to grow thereon.

Still referring to FIGS. 6A and 6B, the method 100 then proceeds to forming gate spacers 234 over the dummy gate stacks 226. A spacer material layer may be deposited conformally on top and sidewalls of the dummy gate stacks 226 and subsequently etched back to form gate spacers (also referred to as outer spacers, as compared to inner spacers discussed later on) 234. The term "conformally" may be used herein for ease of description upon a layer having substantial same thickness over various regions. The spacer material layer may include a dielectric material such as silicon oxide, silicon nitride, silicon carbide, silicon oxynitride, SiCN films, silicon oxycarbide, SiOCN films, and/or combinations thereof. In some embodiments, the gate spacers 234 includes multiple layers, such as main spacer walls, liner layers, and the like. By way of example, the spacer material layer may be formed by depositing a dielectric material over the dummy gate stacks 226 using processes such as, CVD process, a subatmospheric CVD (SACVD) process, a flowable CVD process, an ALD process, a PVD process, or other suitable process.

The method 100 may subsequently perform an anisotropic etching process to expose portions of the fins 210 adjacent to and not covered by the dummy gate stacks 226 (e.g., in source/drain regions). Portions of the spacer material layer directly above the dummy gate stack 226 may be completely removed by this anisotropic etching process. Portions of the spacer material layer on sidewalls of the dummy gate stacks 226 may remain, thereby forming gate spacers (or outer spacers) 234. In the depicted embodiments, a distance between two gate spacers 234 over adjacent dummy gate stacks 226 is $w_1$.

Figure 7A:
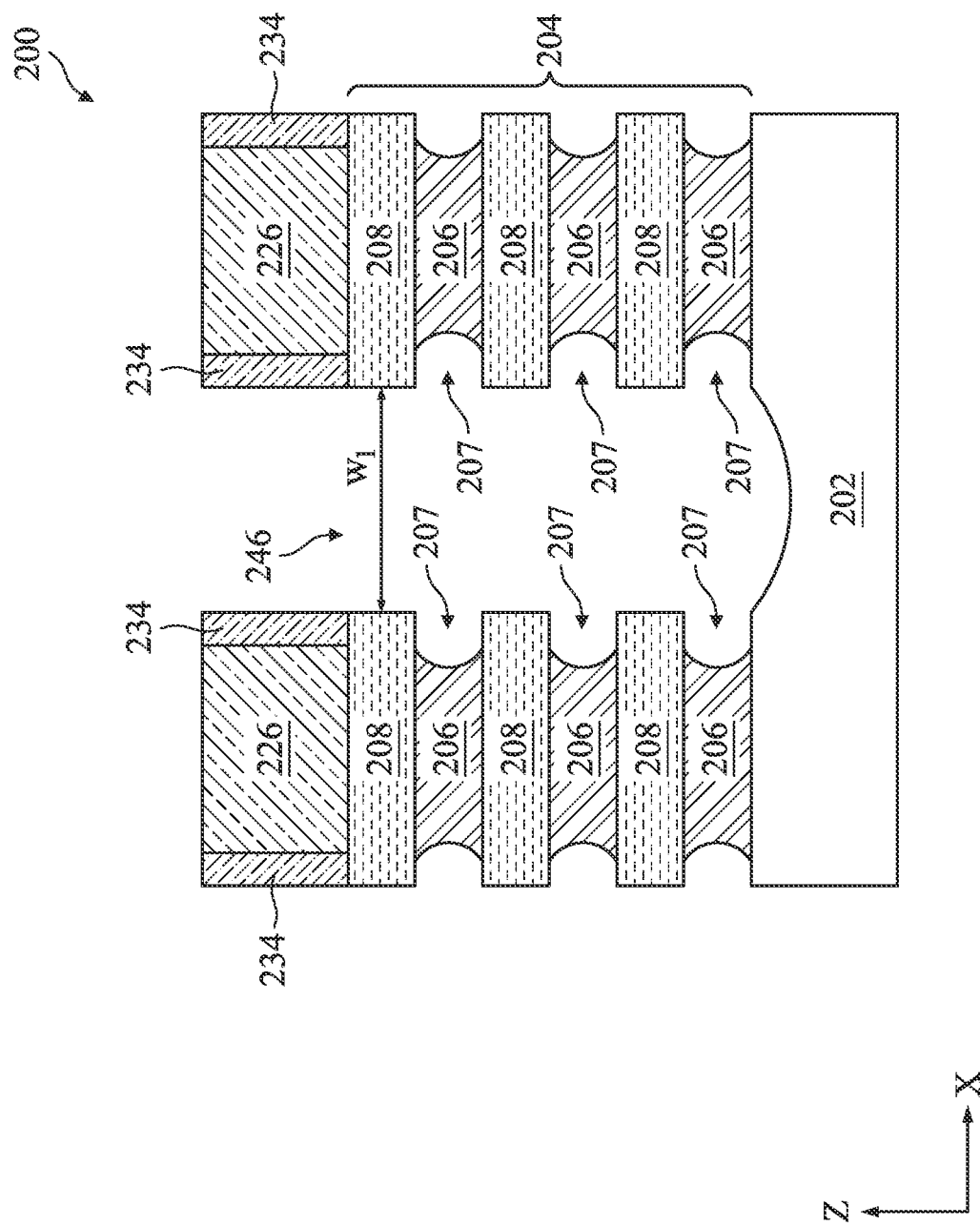
Figure 7B:
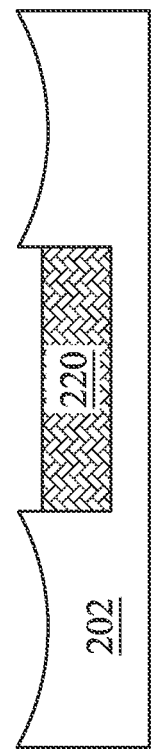
Figure 7B:
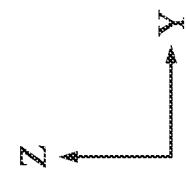

Referring to FIGS. 7A and 7B, the method 100 forms an S/D recess 246 in the fins 210 adjacent to the dummy gate stack 226. In some embodiments, the method 100 implements an etching process that selectively removes portions of the fins 210 in the S/D regions without removing, or substantially removing, the dummy gate stacks 226 and the gate spacers 234. The width $w_1$ is thereby transferred to the S/D recess 246 as shown in FIG. 7A. In the present embodiments, as depicted in FIG. 7A, sidewalls of the epitaxial layers 206 and the epitaxial layers 208, and a top surface of substrate 202 are exposed in the S/D recesses 246. In some embodiments, the remaining bottom portions of the fins 210 are free of the epitaxial stack 204 and have a curved top surface as shown in FIG. 7B. In some embodiments, the etching process is a dry or wet etching process employing a suitable etchant capable of removing Si (i.e., the epitaxial layers 208) and SiGe (i.e., the epitaxial layers 206) of the epitaxial stack 204. In some non-limiting examples, a dry etchant may be a chlorine-containing etchant including $Cl_2$, $SiCl_4$, $BCl_3$, other chlorine-containing gas, or combinations thereof. A cleaning process may subsequently be performed to clean the S/D recesses with a hydrofluoric acid (HF) solution or other suitable solution.

Still referring to FIGS. 7A and 7B, the method 100 selectively removes portions of the epitaxial layer 206 by a suitable etching process to form gaps 207 between layers of the epitaxial layer 208, such that portions of the epitaxial layer 208 suspend in space. As discussed above, the epitaxial layer 208 includes Si and the epitaxial layer 206 includes SiGe. Accordingly, the etching process selectively removes potions of SiGe without removing or substantially removing Si. In some embodiments, the etching process is an isotropic etching process (e.g., a dry etching process or a wet etching process), and the extent of which the epitaxial layer 206 is removed is controlled by duration of the etching process. In an example embodiment, the method 100 selectively removes portions of the epitaxial layer 206 by a wet etching process that utilizes HF and/or $NH_4OH$ as an etchant, which initially oxidizes portions of the epitaxial layer 206 to form $SiGeO_x$ which is removed thereafter.

Figure 8A:
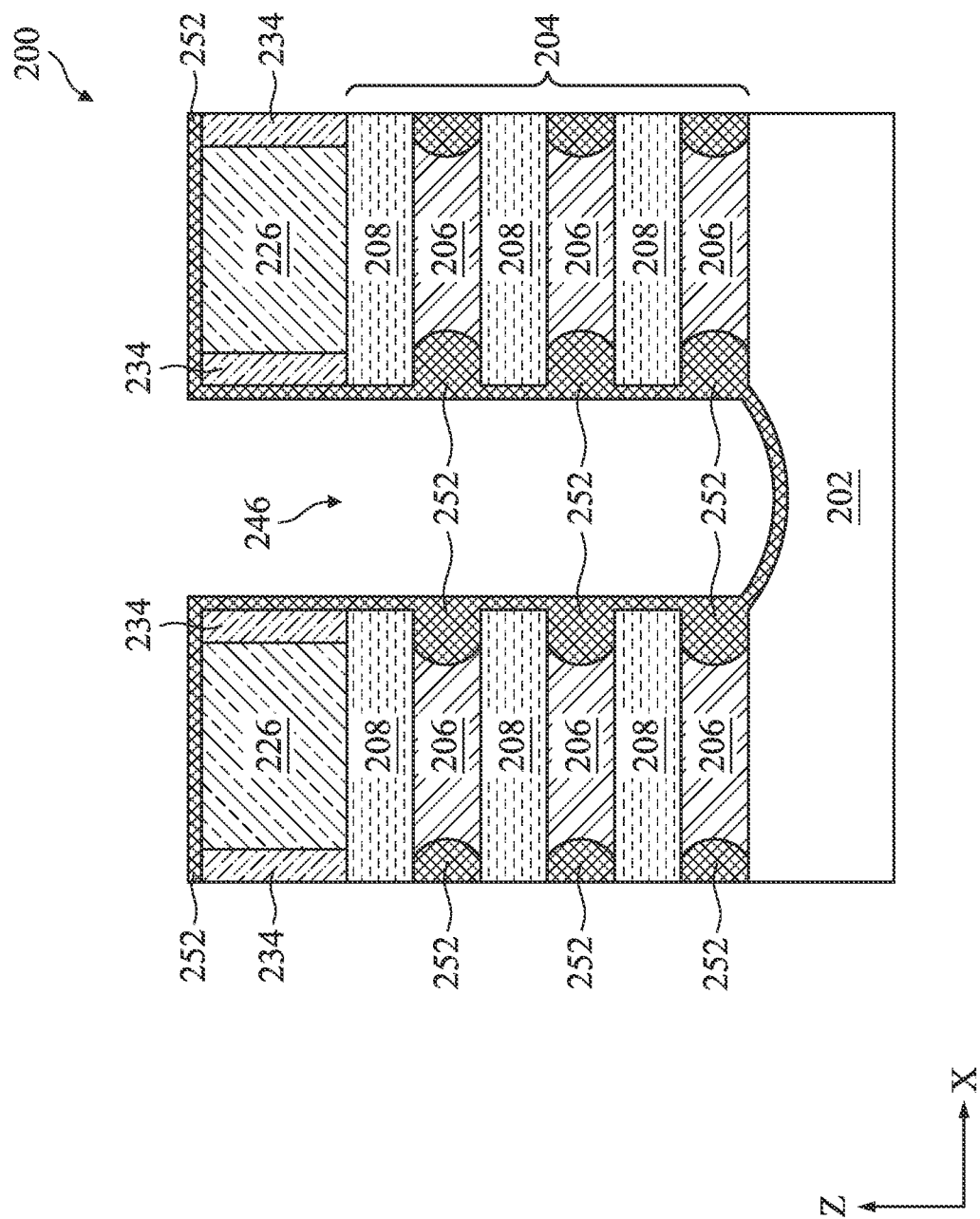
Figure 8B:
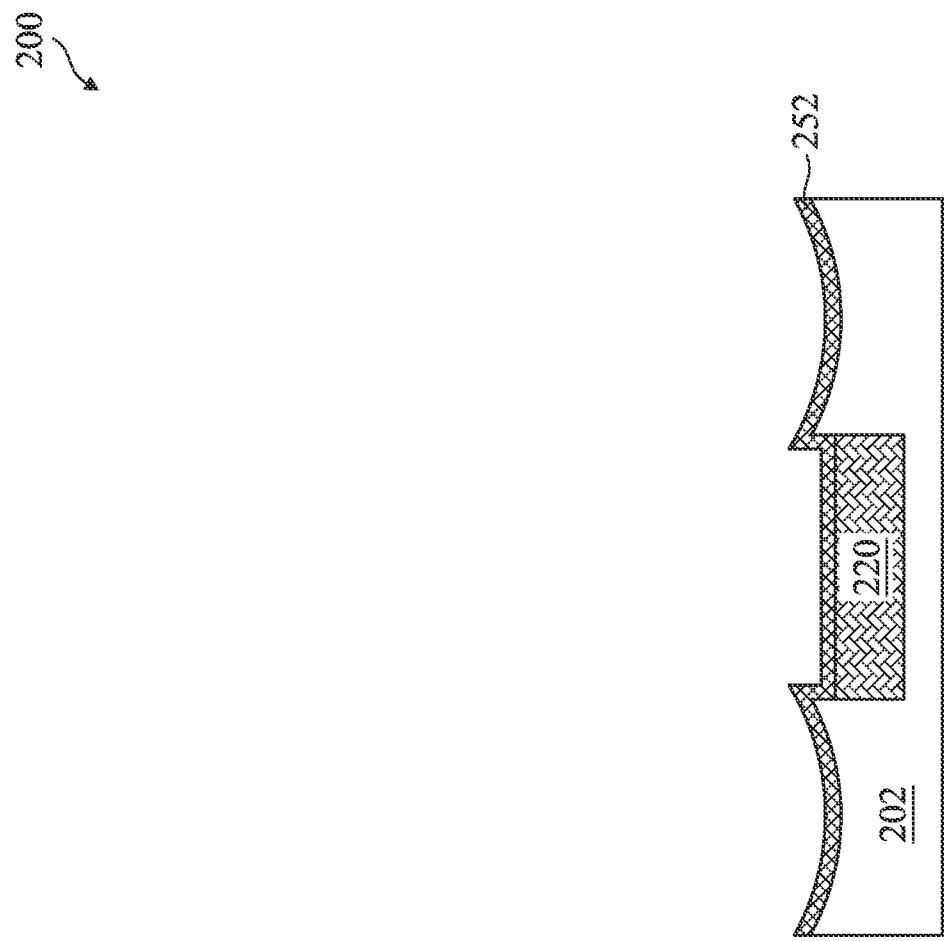

Now referring to FIGS. 8A and 8B, the method 100 deposits a spacer layer 252 over the device 200. In many embodiments, the spacer layer 252 is formed conformally over the device 200, thereby covering the dummy gate stacks 226, the gate spacers 234, and the fins 210 (including the epitaxial layer 206 and epitaxial layer 208). Referring to FIG. 8A, the spacer layer 252 may fill up the gaps 207 between layers of the epitaxial layer 208. In some embodiments, the spacer layer 252 is deposited by any suitable method, such as ALD, to any suitable thickness. In some examples, the spacer layer 252 may include any suitable dielectric material, such as silicon nitride, silicon oxide, silicon carboxynitride, silicon oxycarbide, other suitable dielectric materials, or combinations thereof.

Figure 9A:
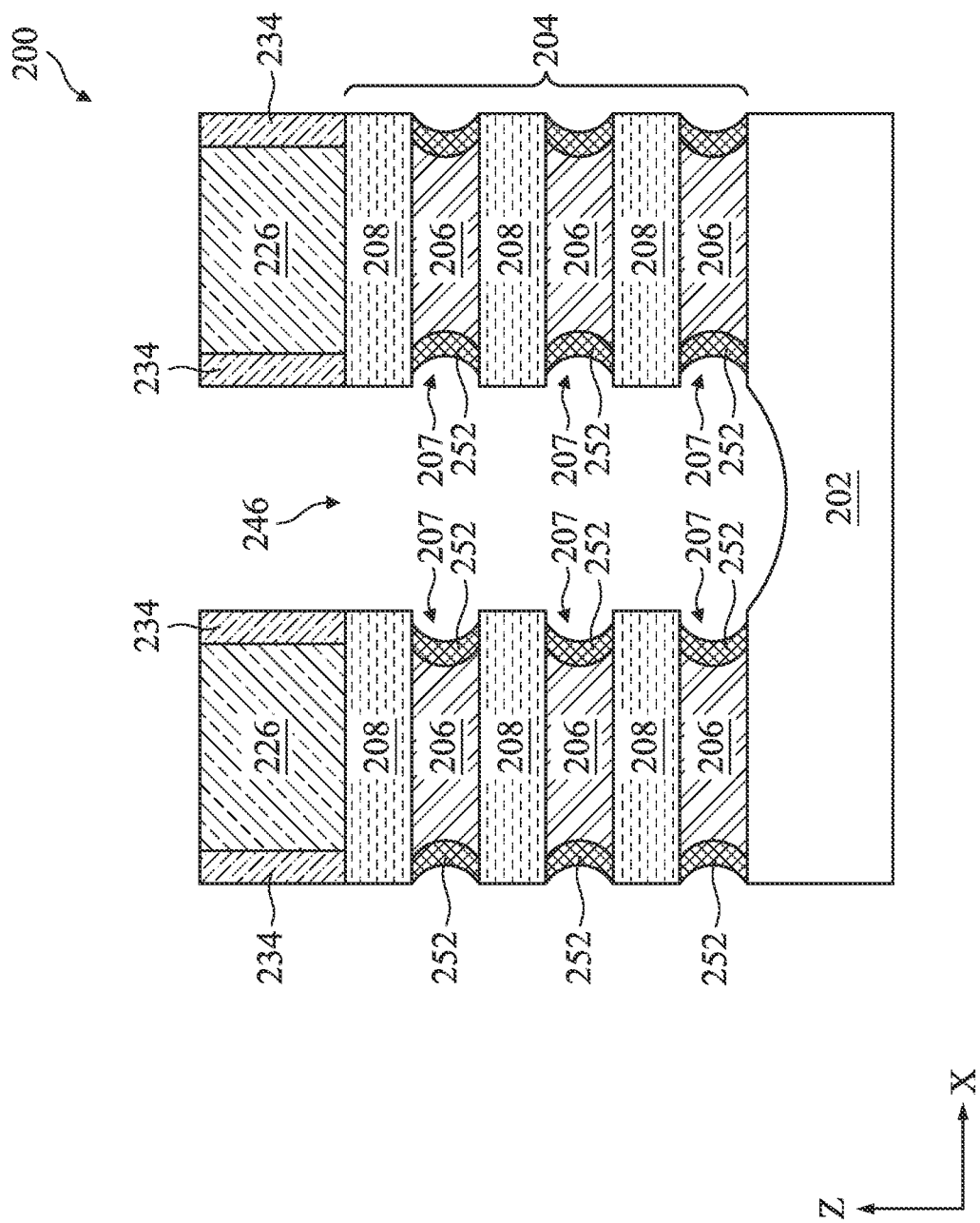
Figure 9B:

Thereafter, referring to FIGS. 9A and 9B, the method 100 removes portions of the spacer layer 252 in an etching process such that only portions of the spacer layer 252 remain on sidewalls of the epitaxial layer 206. The remaining portions of the spacer layer 252 are referred to as inner spacers 252 hereafter. The inner spacers 252 are configured to facilitate subsequent fabrication steps for forming multi-gate devices. In some examples, the inner spacers 252 are configured to isolate the subsequently formed S/D feature and the metal gate stack formed thereafter. In some embodiments, the etching process is an isotropic etching process, and the extent of which the spacer layer 252 is removed is controlled by duration of the etching process. In some examples, a thickness of the spacer layer 252 removed by the etching process may be about 3 nm to about 7 nm. Of course, the present disclosure is not limited to this range of dimensions.

Figure 10A:
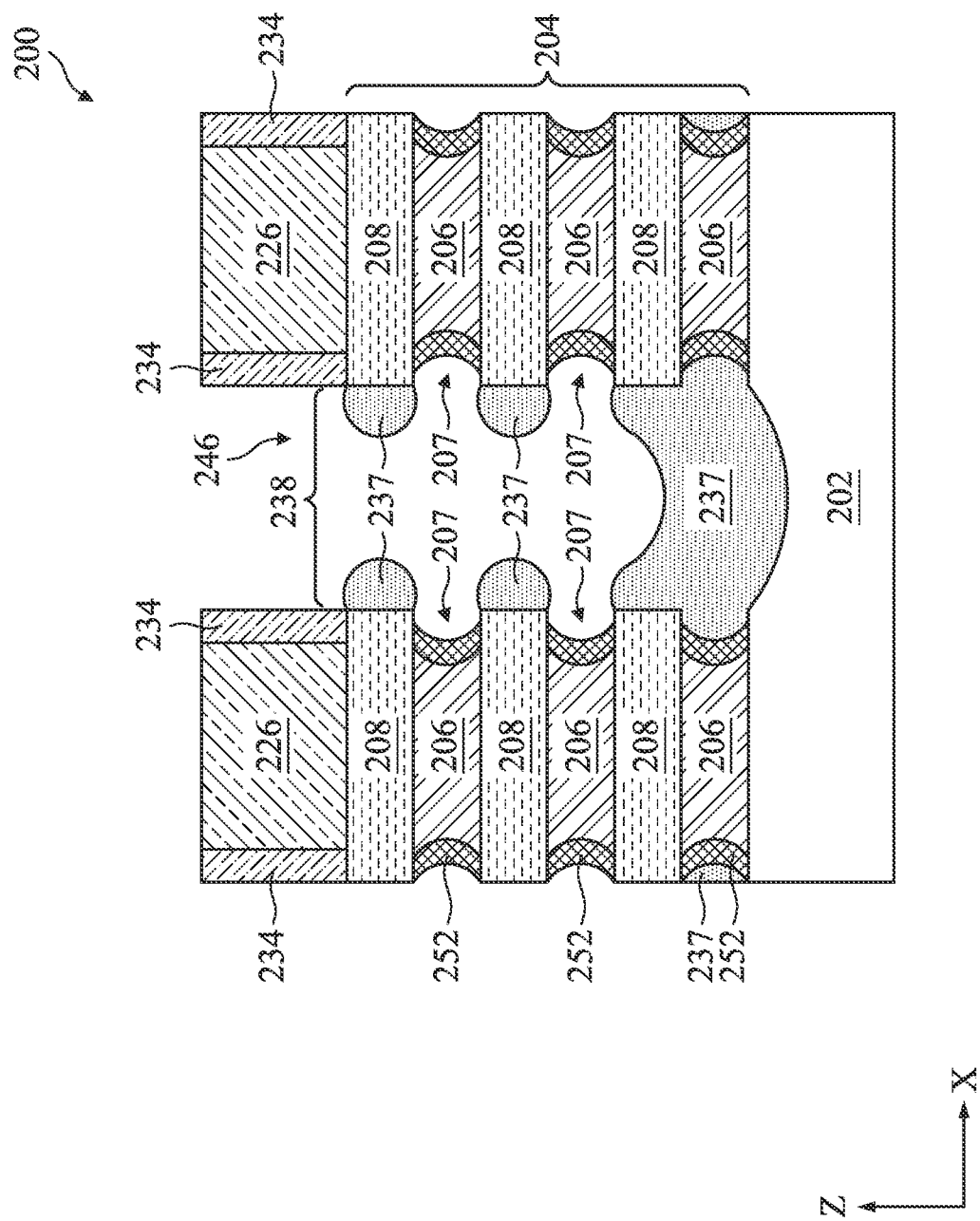
Figure 10B:
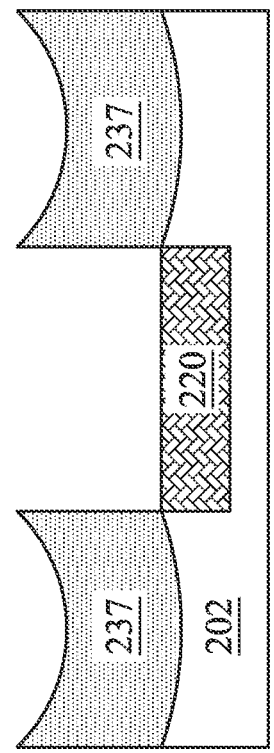

Referring to FIGS. 1A, 10A, and 10B, the method 100 proceeds to operation 112 to form an S/D feature 238 in the S/D recess 246. The S/D feature 238 may include multiple epitaxial semiconductor layers, e.g., an S/D layer 237 and an S/D layer 239. The S/D layer 237 is selectively grown from semiconductor surfaces exposed in the S/D recess 246. In the present embodiments, the S/D layer 237 is formed over sidewalls of the epitaxial layer 208 and a top surface of the substrate 202 exposed in the S/D recess 246 as illustrated in FIG. 10A, thereby filling portions of the S/D recess 246. A portion of S/D layer 237 grown from sidewalls of the bottommost epitaxial layer 208 merges with another portion of the S/D layer 237 grown from the top surface of the substrate 202, thereby filling the bottommost gaps 207 and leaving remaining gaps 207 free of the S/D layer 237. In some embodiments, the inner spacer 252 in each of the gaps 207 contacts the S/D layer 237. In the present embodiments, a portion of the S/D layer 237 is over (higher than) the top surface of the topmost epitaxial layers 208 (referred as fin top hereafter). In other words, the fin top is between the topmost surface of the S/D layer 237 and the substrate 202. In the present embodiments, the S/D layer 237 grown from the topmost epitaxial layer 208 contacts the gate spacer 234; of course, the present disclosure is not limited to such configuration. As discussed in further details below, in some embodiments, the S/D layer 237 is substantially free of dopant or has less dopant concentration compared with the S/D layer 239 formed thereafter, which improves substrate leakage performance.

Figure 11A:
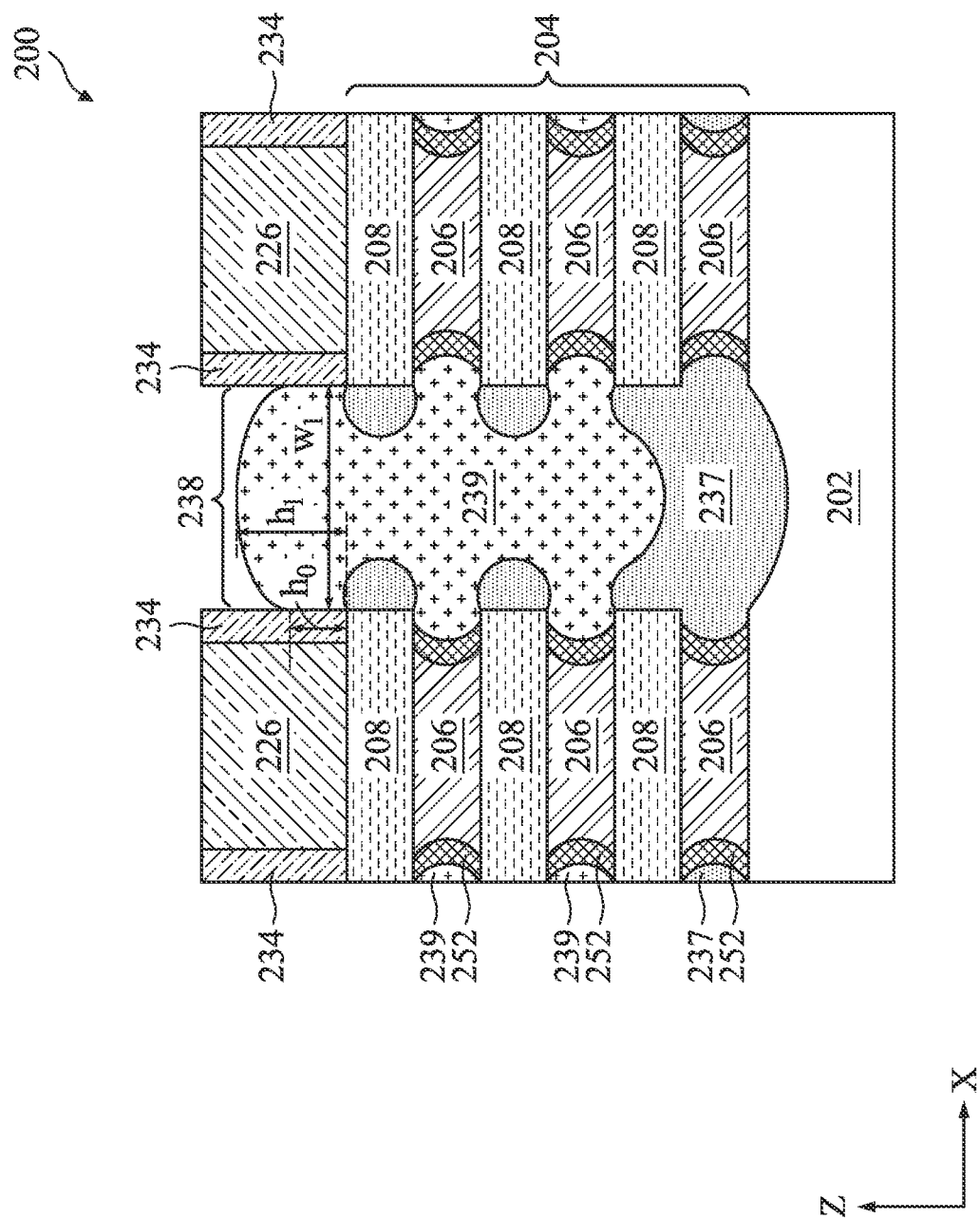
Figure 11B:
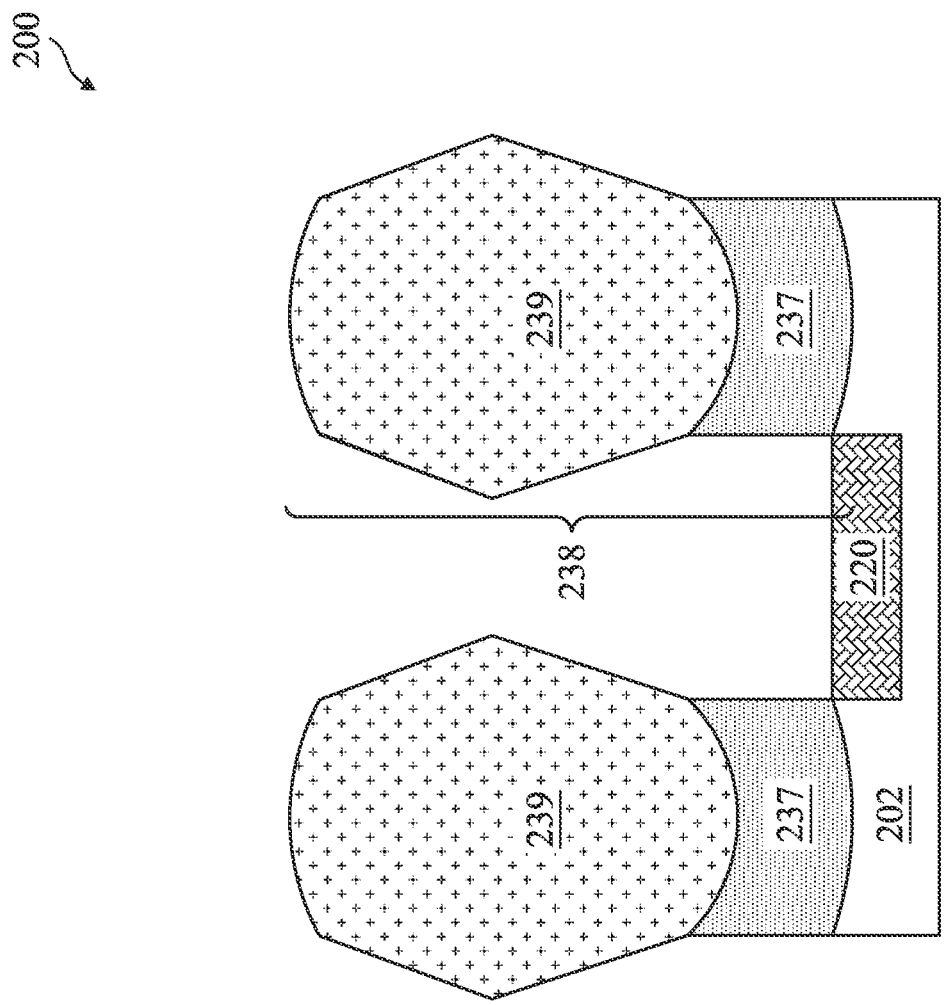

Referring to FIGS. 11A and 11B, the method 100 forms the S/D layer 239 over the S/D layer 237, thereby filling the remaining gaps 207 and the remaining portions of the S/D recess 246. In the present embodiments, a top portion of the S/D layer 239 extends over (higher than) the fin top and is disposed between the gate spacers 234. The S/D layer 239 contacts and shares common edges with the gate spacers 234, where the common edges is defined by a height $h_0$. Stated differently, the top portion of the S/D layer 239 laterally spans across the gap between two gate spacers 234. The S/D feature 238 is such configured to accommodate subsequent S/D feature modifying operation. These are, of course, merely examples and are not intended to be limiting. For example, the S/D layer 239 may be free of contact from the gate spacers 234. In the present embodiments, the S/D layer 239 covers the previously formed S/D layer 237, such that the S/D layer 237 does not expose in the gap between the gate spacers; of course, the present disclosure is not limited to such configuration. For example, the S/D layer 239 may not entirely (or completely) cover the S/D layer 237, thereby leaving a portion of the S/D layer 237 exposed in the gap between the gate spacers. In the depicted embodiments as shown in FIG. 11A, the top portion of the S/D feature over the fin top is an inverse U shape (or a dome shape) including a portion of the S/D layer 237 and a portion of the S/D layer 239. In some embodiments, the top portion of the S/D feature is defined by the width $w_1$ and a height $h_1$. In the present embodiments, the height $h_1$ (measured from the fin top along z direction) is about 5 nm to about 15 nm, and the width $w_1$ is about 12 nm to about 25 nm.

The S/D feature 238 (including the S/D layers 237 and the S/D layer 239) may be formed by any suitable method, such as MBE, CVD deposition techniques (e.g., vapor-phase epitaxy (VPE), MOCVD and/or ultra-high vacuum CVD (UHV-CVD)), molecular beam epitaxy, other suitable epitaxial growth processes, or combinations thereof. The epitaxial growth process may use gaseous and/or liquid precursors, which interact with the composition of the substrate 202. In some embodiments, the adjacent S/D features 238 grown on adjacent fins 210 are spaced apart from each other, as depicted in FIG. 11B. Alternatively, the adjacent S/D features 238 may merge together (not shown). the S/D features 238 may include Ge, Si, GaAs, AlGaAs, SiGe, GaAsP, SiP, or other suitable material. The S/D features 238 may be in-situ doped during the epitaxial process by introducing doping species including: p-type dopants, such as boron or $BF_2$; n-type dopants, such as phosphorus or arsenic; and/or other suitable dopants including combinations thereof. If the S/D features 238 are not in-situ doped, an implantation process (i.e., a junction implant process) is performed to dope the S/D features 238.

In some embodiments, the S/D layer 239 differs from the S/D layer 237 in amounts of the dopants. In some examples, the amounts of the dopants included in the S/D layer 239 is greater than that included in the S/D layer 237. In some embodiments, the S/D layer 237 includes SiGe with a percentage of Ge (Ge %) about 10% to about 20%, while the S/D layer 239 includes SiGe with a Ge % about 40% to about 60%. In the present embodiments, the S/D layer 237 and/or the S/D layer 239 include boron (B). In some examples, a concentration of B in the S/D layer 237 is about $1.7 \times 10^{-20}$ to about $3.7 \times 10^{-20}$. In some examples, a concentration of B in the S/D layer 239 is about $3 \times 10^{-21}$ to about $7 \times 10^{-21}$. In some embodiments, the S/D layer 237 includes SiB with a concentration of B about $1.7 \times 10^{-20}$ to about $3.7 \times 10^{-20}$. In some embodiments, the S/D layer 239 has a gradient dopant concentration, where the dopant concentration gradually increases from a bottom portion to a top portion of the S/D layer 239; of course, the present disclosure is not limited to this configuration. Furthermore, silicidation or germano-silicidation may be formed on the S/D features 238. For example, silicidation, such as nickel silicide, may be formed by depositing a metal layer over the S/D feature 238, followed by annealing the metal layer such that the metal layer reacts with silicon in the S/D feature 238 to form the metal silicidation. The non-reacted metal layer is subsequently removed after the annealing.

Generally, the morphology of the S/D feature (e.g., the top portion of the S/D feature above the fin top) changes during the forming of the S/D contact in a subsequent process, which is referred to as "landing effect". For example, the top portion of the S/D feature is pushed downwards toward the substrate and/or outwards toward the adjacent gate spacers. In the cases that $h_1$ is too high, the S/D feature is squeezed sideways against the adjacent spacers during the landing of the S/D contact, thereby increasing the height $h_0$ and the contact surface area of the S/D feature and the gate spacers. The increased contact surface area in turn increases the parasitic capacitance between the S/D feature and the gate spacers, which leads to RC delay and low device processing speed. On the other hand, in the cases that the S/D feature is too low (e.g., $h_1$ is too small or the S/D feature is lower than the fin top), the landing of the subsequently formed S/D contact presses the S/D feature even lower (e.g., below the fin top), thereby causing gaps between the epitaxial layers 208 disposed on opposite sides of the S/D feature. The gap interrupted the current pathway and thereby increased the resistance of the device 200.

The present embodiments are directed to methods of modifying the S/D feature to reduced parasitic capacitance without compromising other aspects of the design requirements, such as device resistance. Specifically, the top portion of the S/D feature is modified to a morphology to accommodate the landing of the subsequently formed S/D contact over the S/D feature, such that the parasitic capacitance is reduced without causing other inadvertent damage (e.g., increasing resistance) to the device 200.

Referring to FIGS. 1A, 1B, 12A and 12B, the method 100 then proceeds to a modification operation 114 to modify (or trim, reshape) the morphology of the S/D feature 238. The modification operation 114 includes a surface treatment step 114a (or 114a') followed by an etching step 114b (or 114b') to remove the treated surface of the S/D feature 238, as depicted in FIG. 1B. The surface treatment step 114a (or 114a') chemically changes the properties of a top surface of the S/D feature, without altering or substantially altering the neighboring components (e.g., the gate spacers 234 and dummy gates stacks 226). The treated top surface demonstrates an increased etching selectivity with respect to the neighboring components in the following etching process compared to the un-treated top surface. In some examples, the selectivity of the treated top surface is over about 100 times greater than the un-treated top surface. The treated surface remains as a surface portion of the S/D feature 238. Thereafter, the modification operation 114 performs an etching step 114b (or 114b') to selectively remove the treated top surface of the S/D feature, thereby physically change the morphology of the S/D feature 238 by reduce the height $h_1$ and/or the width $w_1$ of the top portion of the S/D feature 238. The neighboring components (e.g., gate spacers 234 and dummy gate stacks 226) and the untreated portion underneath the treated surface of the S/D feature remain intact or substantially intact during the etching process.

Referring to FIG. 1B, in the present embodiments, the surface treatment step 114a (or 114a') in the modification operation 114 is a plasma treatment (e.g., decoupled plasma treatment) utilizing $NH_3$, $N_2$, He and/or $O_2$ as ambient. In some examples, the modification operation 114 includes the surface treatment step 114a utilizing oxygen $O_2$ in the ambient. The surface treatment step 114a is thereby referred to as surface oxidation. During the plasma treatment, the oxygen radicals react with components of the top surface of the S/D feature 238 (e.g., Si) to produce respective oxides (e.g., $SiO_x$ ($1 \leq x \leq 2$)), thereby forming the treated surface. In alternative examples, the modification operation 114 includes the surface treatment step 114a' utilizing $N_2$ in the ambient. The surface treatment step 114a' is thereby referred to as surface nitridation. During the plasma treatment, the nitrogen radicals react with components (e.g., Si) to produce their respective nitride ($Si_3N_4$), thereby forming the treated surface. These are, of course, merely examples and are not intended to be limiting. In some embodiments, power of the decoupled plasma treatment ranges from about 500 Watts to 2000 Watts. In some embodiments, the operation temperature of the decoupled plasma systems ranges from about 200° C. to about 400° C.

Still referring to FIG. 1B, the etching step 114b (or 114b') in the modification operation 114 may include wet etching, dry etching, reactive ion etching, or other suitable etching methods. In some examples, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In alternative examples, a wet etching process may comprise etching in diluted hydrofluoric acid (DHF), potassium hydroxide (KOH) solution, ammonia, a solution containing hydrofluoric acid (HF), nitric acid ($HNO_3$), and/or acetic acid ($CH_3COOH$), or other suitable wet etchants.

In a specific example where the treated top surface after oxidation includes $SiO_2$, (e.g., 114a) an etchant gas containing HF and $NH_3$ is applied in the following etching step (e.g., 114b) at temperature under 45° C. The low temperature keeps the etchant in a high etching selectivity towards the oxide. The chemical reaction can be described as

$10HF+2SiO_2+2NH_3 \rightarrow SiF_4\uparrow+4H_2O\uparrow+(NH_4)_2SiF_6$ where byproduct ammonium hexafluorosilicate (($NH_4)_2SiF_6$) remains in solid form. The etching step (e.g., 114b) may subsequently increase the temperature to decompose the byproduct, such as at a temperature about 80° C. The chemical reaction can be described as

$(NH_4)_2SiF_6 \rightarrow SiF_4\uparrow+2NH_3\uparrow+2HF\uparrow$

After the byproduct is decomposed, the untreated portion of the S/D feature 238 underneath the treated surface is exposed. By removing the surface portion in etching step (e.g., 114b), the top surface of the S/D feature 238 is modified (or reshaped).

In an alternative example where the treated top surface after nitridation includes $Si_3N_4$ (e.g., 114a'), an etchant gas containing HF and $NH_3$ is applied at temperature under 45° C. in the subsequent etching step (e.g., 114b'). The low temperature keeps the etchant in a high etching selectivity towards the oxide. The chemical reaction can be described as

$16HF+NH_3+Si_3N_4 \rightarrow NH_3\uparrow+SiF_4\uparrow+(NH_4)_2SiF_6$ where byproduct ammonium hexafluorosilicate (($NH_4)_2SiF_6$) remains in solid form. The etching step (e.g., 114b') may subsequently increase the temperature to decompose the byproduct, such as at a temperature about 80° C. The chemical reaction can be described as

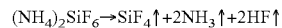

$(NH_4)_2SiF_6 \rightarrow SiF_4\uparrow+2NH_3\uparrow+2HF\uparrow$

After the byproduct is decomposed, the untreated portion of the S/D feature 238 underneath the treated surface is exposed. By removing the surface portion in etching step (e.g., 114b'), the top surface of the S/D feature 238 is modified (or reshaped).

In the present embodiments, as depicted in FIG. 1B, the modification operation 114 includes one or more repeats of surface treatment steps (e.g., 114a or 114a') each of which is followed by an etching step (e.g., 114b or 114b'). The number of the repeats is determined by a pre-set value of the height of the S/D feature 238. In order to precisely control the morphology of the S/D feature, each repeat utilizes milder conditions than its preceding repeats to avoid inadvertent over-etching of the S/D feature. The relatively strong repeats at the beginning accelerates the processing time of the modification operation 114, while the relatively weaker repeats avoid over etching of the S/D feature when approaching its desired morphology. For example, the depth of the surface treatment in each surface treatment step 114a (or 114a') is smaller than the previous surface treatment step 114a (or 114a'). Accordingly, the depth of the treated surface removed in each of the etching step 114b (or 11b') is smaller than the previous etching step 114b (or 11b'). In some embodiments, the depth of the treated surface is controlled by duration, temperature and concentration and/or flow rate of the etchants. In the present embodiments, each repeat of surface treatment and following etching process removes a depth of about 1 nm to about 3 nm.

Figure 12A:
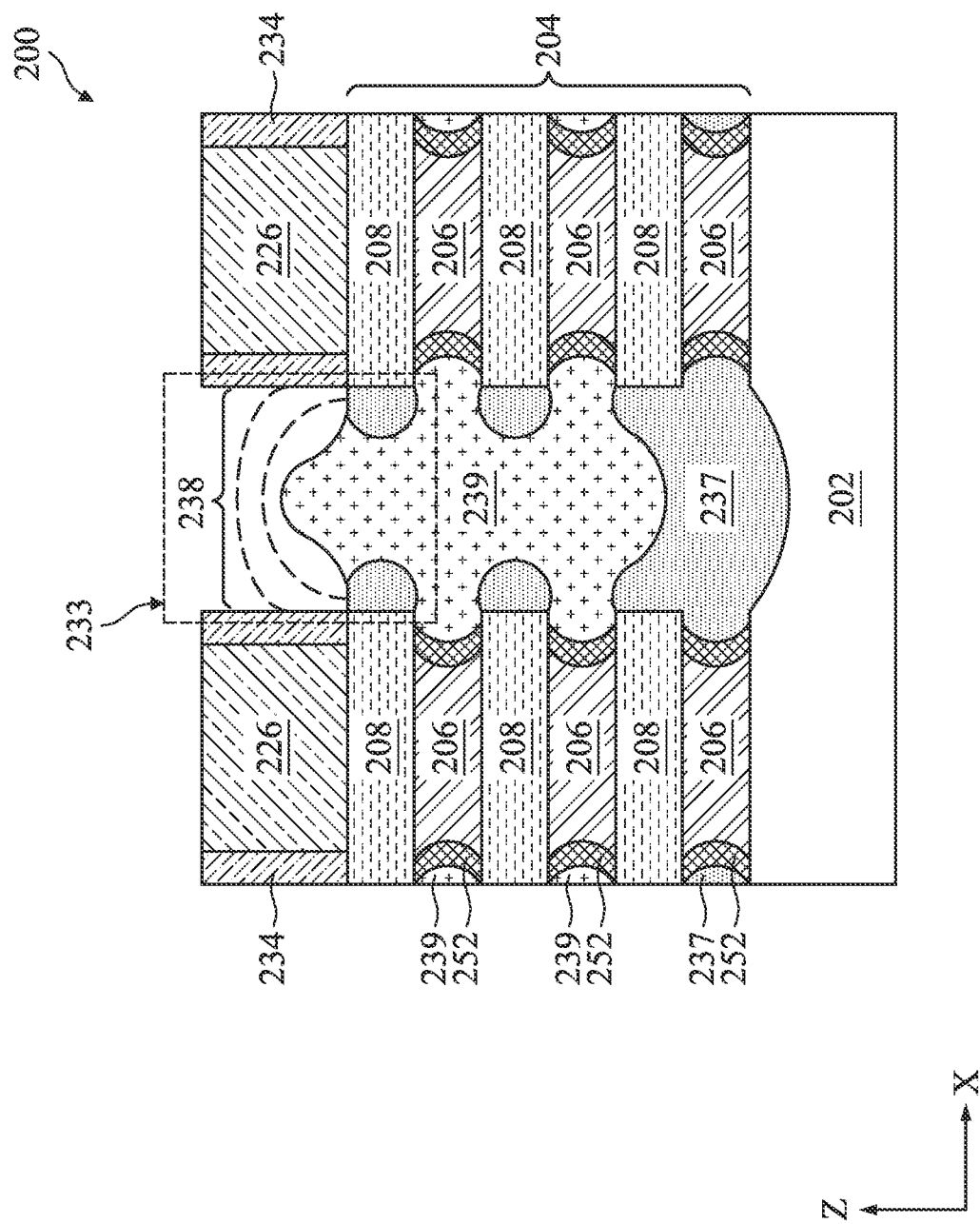
Figure 12C:
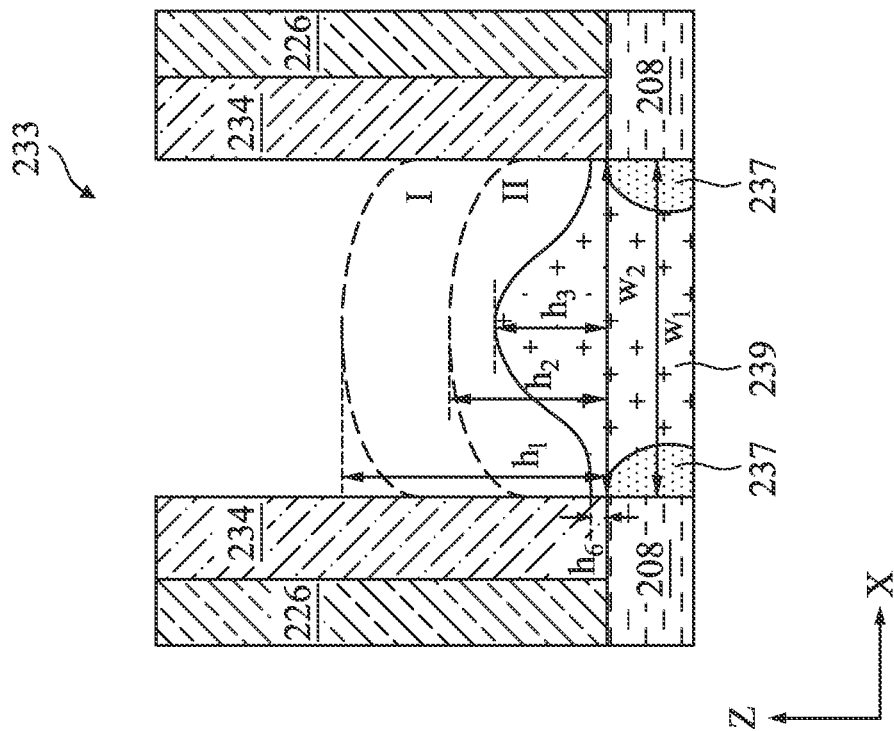
Figure 12D:
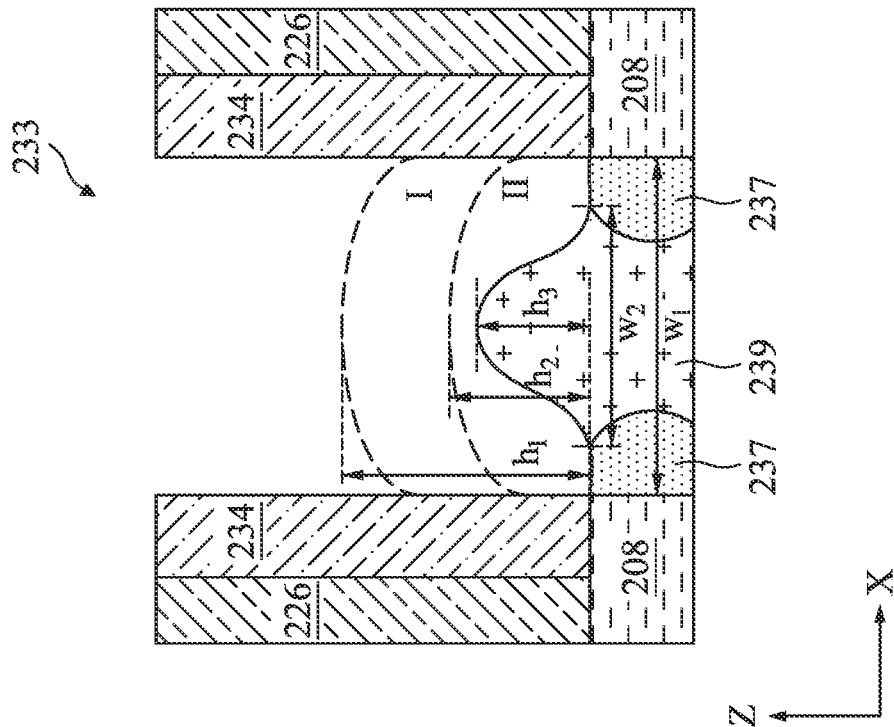

Referring to FIGS. 12A, 12C and 12D, two repeats of surface treatment steps 114a (or 114a') and etching steps 114b (or 114b') are performed in the modification operation 114 of the S/D feature 238 as indicated by the dotted lines. In some embodiments, the first repeat may include the surface treatment step 114a and the etching step 114b, while the second repeat may include the surface treatment step 114a' and the etching step 114b' to achieve different degree of modification in each repeat. A portion 233 of the device 200 shown in FIG. 12A is enlarged in FIGS. 12C and 12D to depict various components during and after the modification operation 114 of the S/D feature 238. A first repeat removes a region I (between two dotted lines), thereby reducing the height $h_1$ to a height $h_2$ while the width $w_1$ of the S/D feature remain the same. A second repeat removes a region II (between the lower dotted line and the top surface of the modified S/D feature 238), where the modification operation 114 not only reduces the height $h_2$ to the height $h_3$ but also reduces the width $w_1$ to the width $w_2$. Alternatively, as depicted in FIG. 12D, the second repeat only reduces the height $h_2$ to $h_3$, the width $w_2$ remains the same as the width $w_1$. In other words, the modification operation 114 (including the first repeat and the second repeat) does not reduce the width $w_1$ of the S/D feature.

It is noted that the second surface treatment step 114a (or 114a') in the second repeat is milder than the first surface treatment step 114a (or 114a') in the first repeat. For example, the second surface treatment 114a (or 114a') has weaker power, shorter duration or lower temperature than that of the first surface treatment 114a (or 114a'). Similarly, the second etching step 114b (or 114b') is weaker than the first etching step 114b (or 114b') in the first repeat. For example, the second etching step 114b (or 114b') utilizes etchants with less concentration and/or flow rate, shorter duration, and/or lower temperature than that of the first etching step 114b (or 114b'). As a result, the height reduction in the second repeat is less than the height reduction in the first repeat, thereby avoiding over etching of the S/D feature at the second repeat. The two regions I and II and corresponding two repeats of the surface treatments and etching processes are provided for illustration purposes, and therefore does not necessarily limit the embodiments of the present disclosure to any number of repeats in the modification operation 114. For example, the number of repeats may range from 1 to 10.

Referring to FIGS. 12C and 12D, the modification of the S/D feature 238 removes a portion of the S/D layer 239 and/or a portion of the S/D layer 237. As depicted in FIG. 12C, the S/D layer 237 re-exposes in the gap between the gate spacers; of cause, the present embodiments are not limited to such configuration, for example, the S/D layer 239 may still cover the S/D layer 237 after the modification of the S/D feature 238 as depicted in FIG. 12D. In the present embodiments, the top portion of the modified S/D feature 238 demonstrates an inverse V shape (or horn shape) between the gate spacers 234, with a height $h_3$ less than the height $h_1$ of the U-shaped top portion of the S/D feature before modification. In some examples, the height $h_3$ is about 30% to about 50% of the height $h_1$. In some examples, the height $h_3$ equals to or is less than about 10 nm. In the depicted embodiment shown in FIG. 12C, the modified S/D feature is free of contact from the gate spacers 234. Alternatively, as depicted in FIG. 12D, the modified S/D feature (the S/D layer 237 and/or the S/D layer 239) may still contact the gate spacers 234. The height $h_6$ of the shared surface (common edge) between the modified S/D feature 238 and the gate spacers 234 is less than the height $h_0$ before modification. In the present embodiments, the width $w_2$ of the top portion of the modified S/D feature above the fin top equals to or is less than the width $w_1$, depending on the ending point of the modification operation 114. In some examples, the width $w_2$ equals to or is greater than 50% of the width $w_1$. In some examples, the width $w_2$ equals to the width $w_1$. In some examples, the width $w_2$ is about 14 nm to about 21 nm. The ratios of $h_3/h_1$ and $w_2/w_1$ stated above may be advantageous to mitigate "landing effect" discussed above. For example, if the ratios are less than the given ranges, the S/D feature 238 may be over etched, which in turn increases resistance along current pathway. On the other hand, if the ratios are larger than the given ranges, the S/D feature 238 may be under etched, which in turn increases parasitic capacitance between the S/D contact and the gate stacks.

The method 100 may complete the modification operation 114 here as show in FIG. 1B and proceeds to subsequent operations in FIG. 1A, such as forming an inter-layer dielectric layer in operation 116. Alternatively, the method 100 may include an alternative embodiment of the modification operation 114 as provided below in detail with respect to FIGS. 1C and 13-17. The alternative embodiment of the modification operation 114 involves a patterning process to selectively modify certain S/D features (e.g., narrower and taller S/D features) while maintain remaining S/D features (e.g., wider and shorter S/D features) intact.

Figure 13:
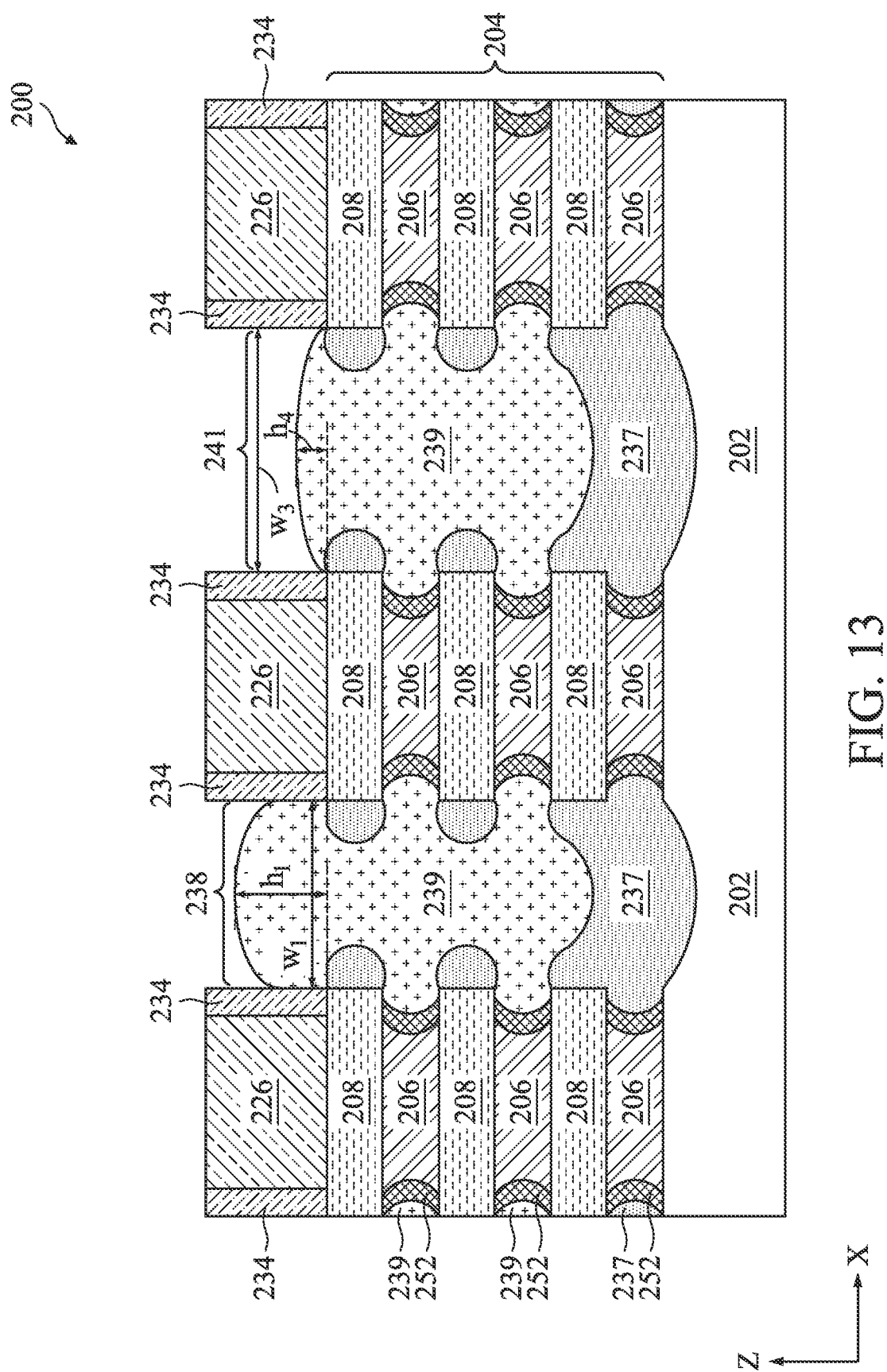

Now referring to FIGS. 1A, 1C and 13, prior to the modification operation 114, the method 100 may form the S/D feature 238 and an S/D feature 241 with uneven top surfaces at the conclusion of operation 112. The uneven top surfaces of the S/D features 238 and 241 may be due to different S/D recess widths (or gate spacing), such that S/D features (e.g., S/D feature 238) in narrower S/D recesses exhibit higher vertical growth rate and accordingly higher top surface. The top portion of the S/D feature 238 above the fin top has a height $h_1$ and a width $w_1$. A top portion of the S/D feature 241 over the fin top has a height $h_4$ and a width $w_3$, where $h_1$ is greater than $h_4$ and $w_1$ is less than $w_3$. In some embodiments, the width $w_3$ is about 18 mm to about 25 nm. The S/D feature 241, if subjected to the same modification operation 114 as that of the S/D feature 238, may have height reduction that would worsen the landing effect (e.g., increasing the resistance). In this case, a mask is applied to the S/D feature 241 to protect it from being modified, while the S/D feature 238 is modified in the modification operation 114 to reduce the parasitic capacitance and to accommodate the landing effect.

Figure 14:
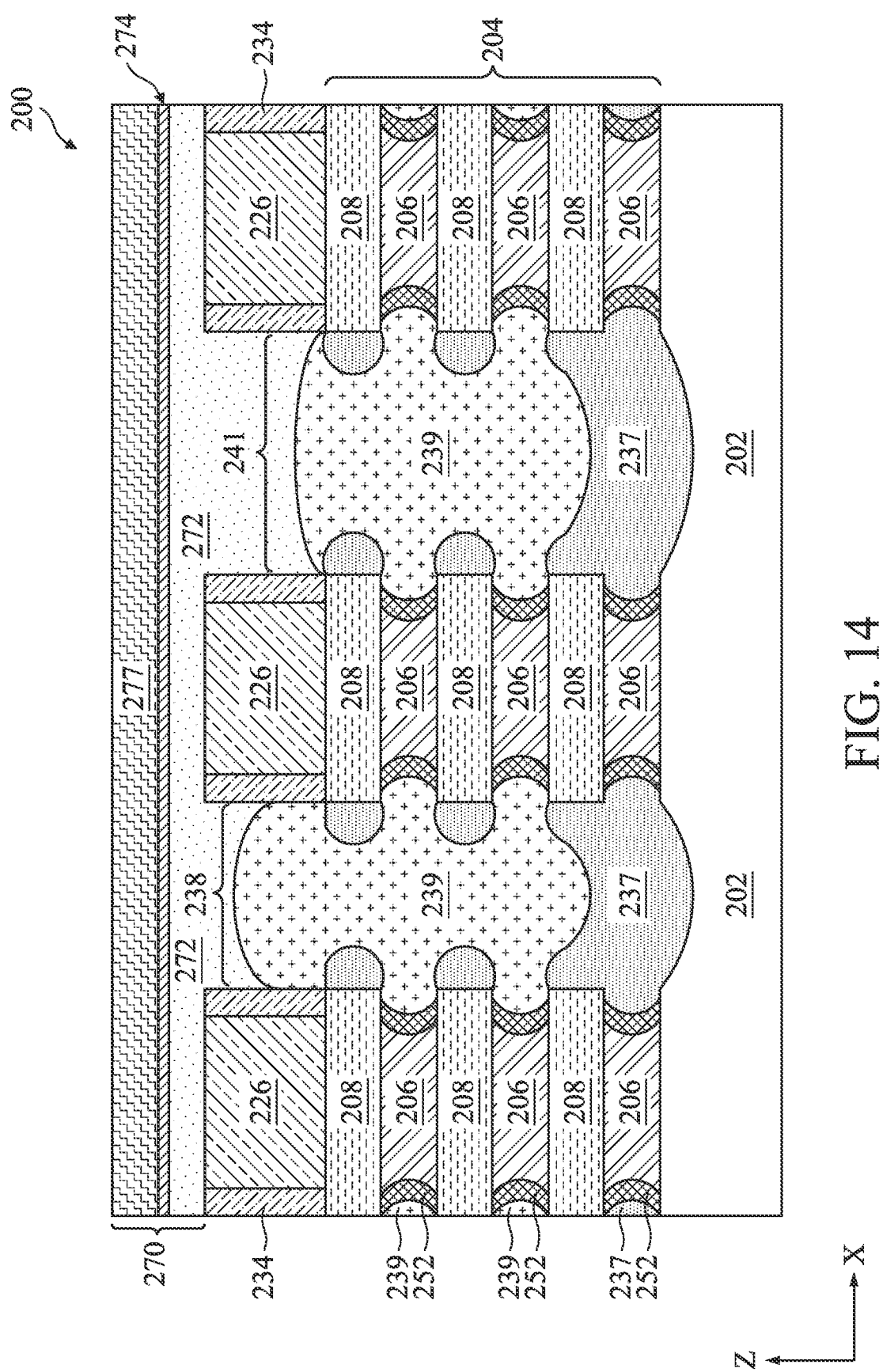

Referring to FIGS. 1C and 14, the modification operation 114 proceed to step 113a to form a multi-layer masking element 270 over the device 200. In some embodiments, the multi-layer masking element 270 is a tri-layer masking element that includes a bottom reflective coating (BARC) 272, a hard mask layer 274 over the BARC 272, and a photosensitive layer 277 over the hard mask layer 274. In some embodiments, the BARC 272 is a carbon-containing organic material, including benzene and/or hydroxyl groups. In some embodiments, the hard mask layer 274 may be a single-layer structure or may include multiple layers each having a different composition. In some embodiments, the hard mask layer 274 may be a polymer layer formed by spin-coating a solution comprising a suitable polymer dissolved in a solvent for forming the hard mask layer 274 over the BARC 272. In some embodiments, the photosensitive layer 277 includes photosensitive materials that causes the layer to undergo a property change when exposed to light, such as ultraviolet (UV) light, deep UV (DUV) light, and/or extreme UV (EUV) light.

Figure 15:
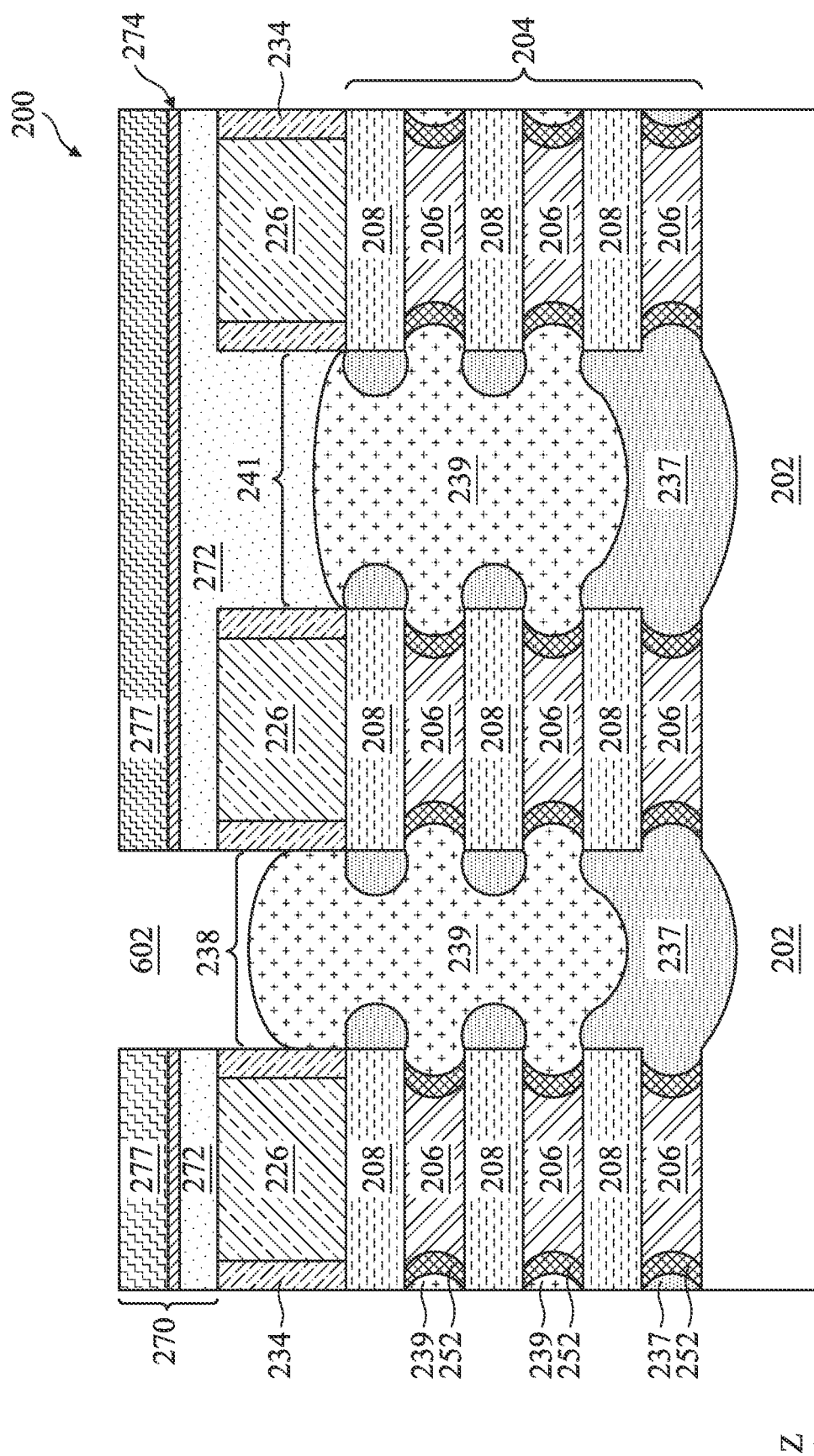

Referring to FIGS. 1C and 15, the modification operation 114 proceed to step 113b to pattern the multi-layer masking element 270 to expose the S/D feature 238 in an opening 602. In some embodiments, the patterning process includes exposing the photosensitive layer 277 to a photomask, performing a post-exposure baking process, developing the exposed photosensitive layer 277, and subsequently etching the hard mask layer 274 and the BARC 272 using the patterned photosensitive layer 277 as an etching mask. The patterned multi-layer masking element 270 is then used as a mask for the following modification process of the S/D feature 238.

Figure 16:
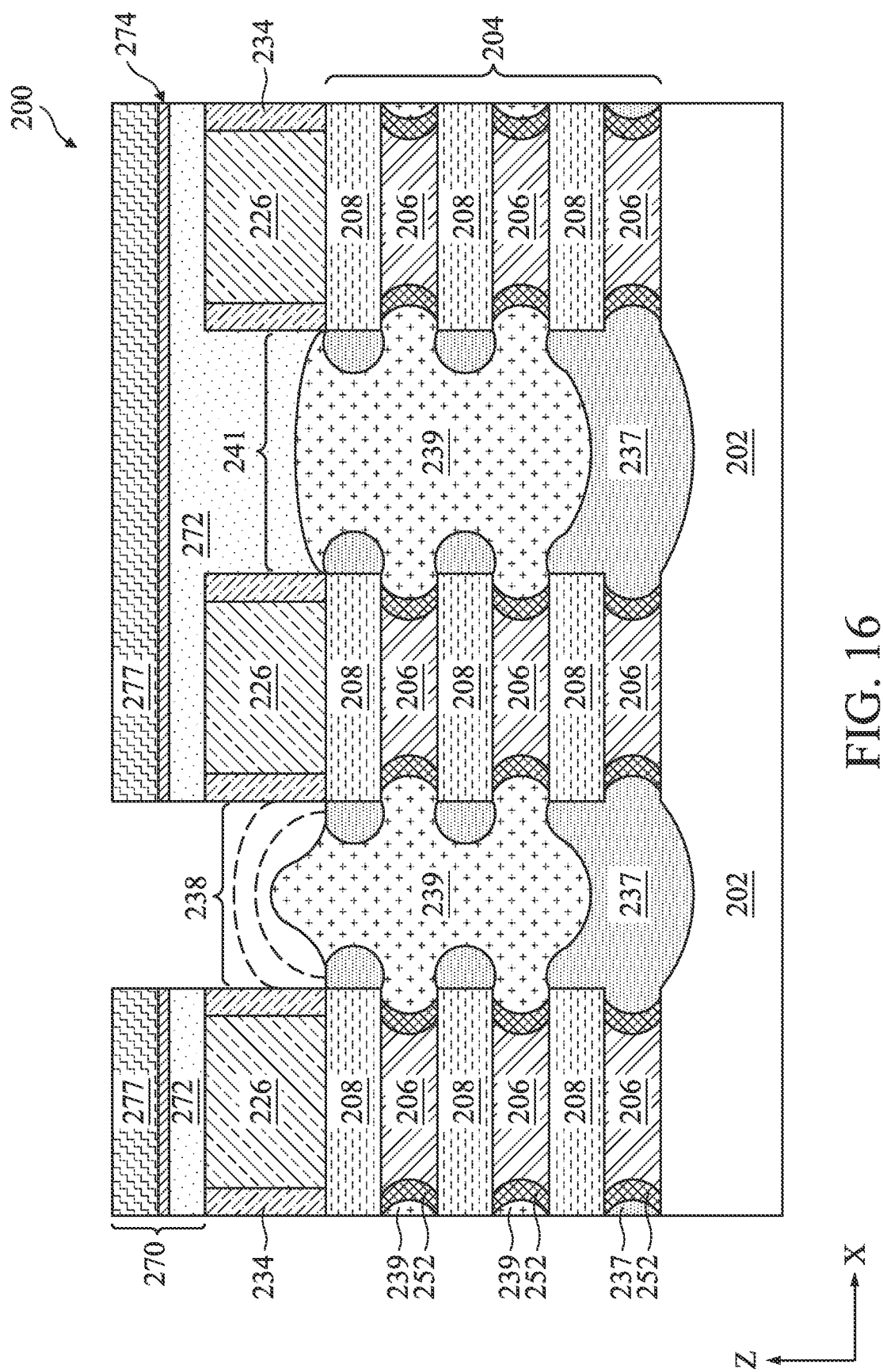

Referring to FIGS. 1C and 16, the modification operation 114 proceed to the surface treatment step 114a and the etching step 114b as explained in detail above regarding FIG. 1B to selectively modify the morphology of the S/D feature 238 exposed in the opening 602, while the S/D feature 241 and other nearby components (e.g., the dummy gate stacks 226 and the gate spacers 234) are covered under the multi-layer masking element 270 and kept intact. As depicted in FIG. 1C, one or more repeats of the surface treatment step 114a and the etching step 114b may be implemented as needed to obtain desire morphology. In each repeat, the surface treatment step 114a and the etching step 114b may be replaced by the surface treatment step 114a' and the etching step 114b', respectively.

Figure 17:
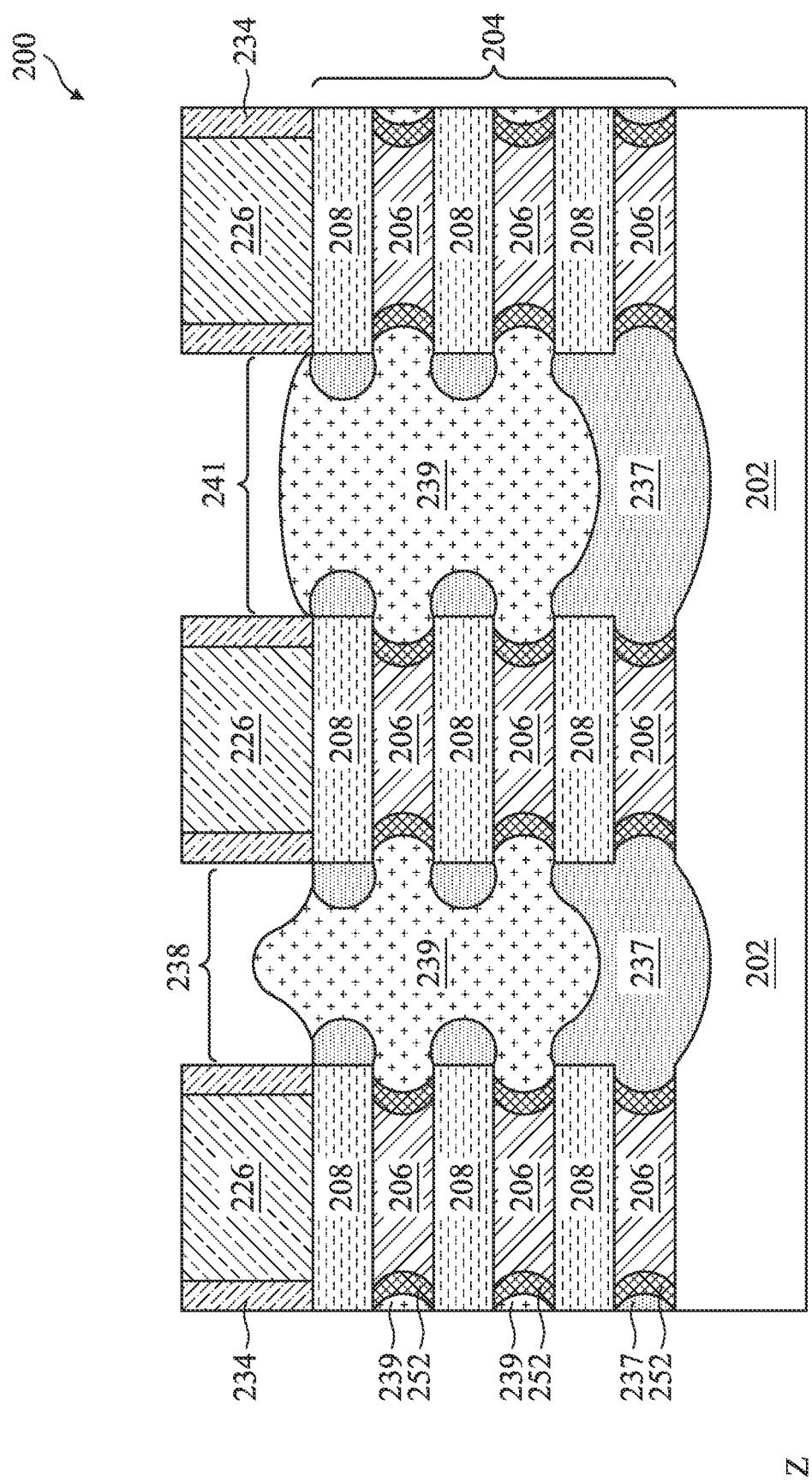

Referring to FIGS. 1C and 17, the modification operation 114 proceed to step 115 by removing the patterned multi-layer masking element 270 after modifying the S/D feature 238. The S/D feature 241 and/or other nearby components (e.g., the dummy gate stacks 226 and the gate spacers 234) are re-exposed after the removing of the multi-layer masking element 270. The removing of the patterned multi-layer masking element 270 may implement resist stripping, plasma ashing, and/or other suitable processes. At the conclusion of operation 114, the height of the S/D feature 238 is reduced. In the illustrated embodiment, the recessed top surface of the S/D feature 238 is still higher than the top surface of the adjacent S/D feature 241, but nonetheless in a satisfied range in mitigating the "landing effect." In various other embodiments, the recessed top surface of the S/D feature 238 may be level or even lower than the top surface of the adjacent S/D feature 241. Further, in the illustrated embodiment, the S/D layer 237 of the S/D feature 238 is exposed after the modification operation 114 such that the S/D layer 239 of the S/D feature 238 is free of contact with the gate spacer 234, while the S/D layer 237 of the S/D feature 241 remains covered under the S/D layer 239 of the S/D feature 241 such that the S/D layer 239 of the S/D feature 241 remains in contact with the gate spacer 234. Alternatively, both S/D layers 239 may be free of contact with the gate spacer 234. Similar to the modification operation 114 depicted in FIG. 1B, the alternative modification operation 114 depicted in FIG. 1C may proceed to subsequent operations as shown in FIG. 1A after the removing of the patterned multi-layer masking element 270, such as forming an inter-layer dielectric layer and operation 116.

Figure 18A:
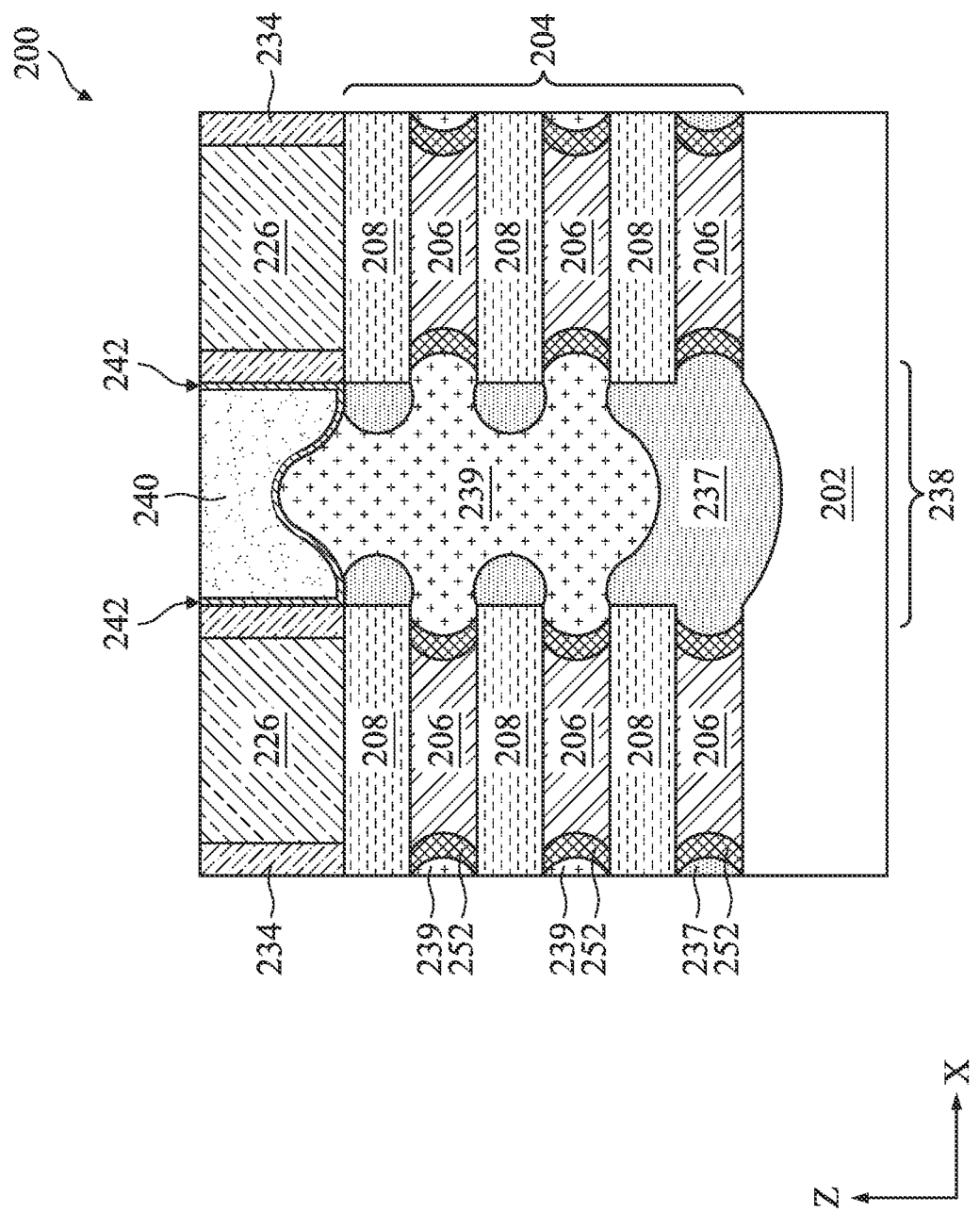
Figure 18B:
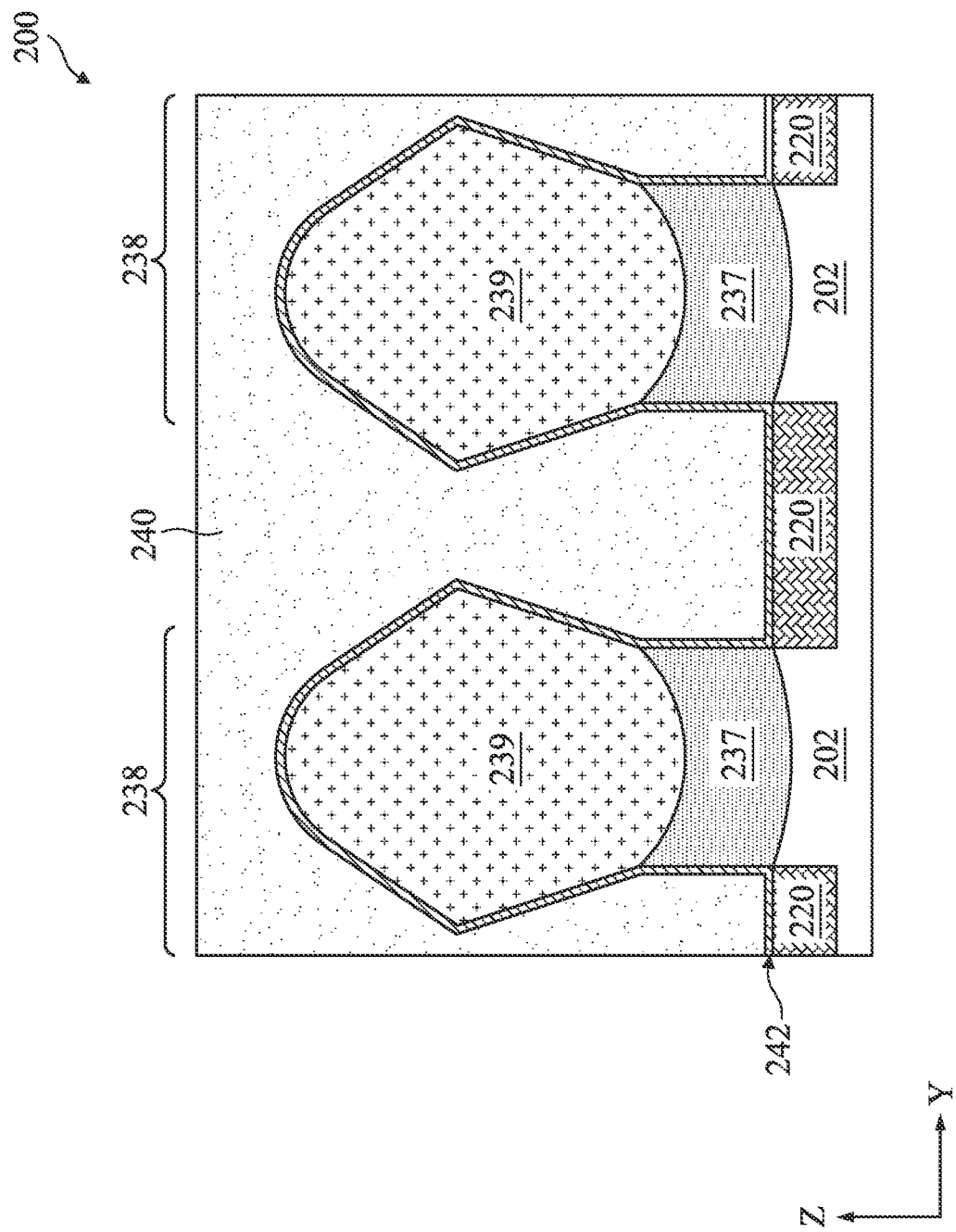

Now referring to FIGS. 1A, 18A and 18B, the method 100 then proceeds to operation 116 to form an inter-layer dielectric (ILD) layer 240 on the substrate. In some embodiments, a contact etch-stop layer (CESL) 242 is also formed prior to forming the ILD layer 240. In some examples, the CESL includes a silicon nitride layer, a silicon oxide layer, a silicon oxynitride layer, and/or other materials known in the art. The CESL 242 may be formed by plasma-enhanced chemical vapor deposition (PECVD) process and/or other suitable deposition or oxidation processes. In some embodiments, the ILD layer 240 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 240 may be deposited by a PECVD process or other suitable deposition technique. In some embodiments, after formation of the ILD layer 240, the semiconductor device 200 may be subject to a high thermal budget process to anneal the ILD layer.

In some examples, after depositing the ILD layer, a planarization process may be performed to remove excessive dielectric materials. For example, a planarization process includes a chemical mechanical planarization (CMP) process which removes portions of the ILD layer 240 (and CESL layer, if present) overlying the dummy gate stacks 226 and planarizes a top surface of the semiconductor device 200. In some embodiments, the CMP process exposes gate electrode layer of the dummy gate stacks 226.

Figure 19A:
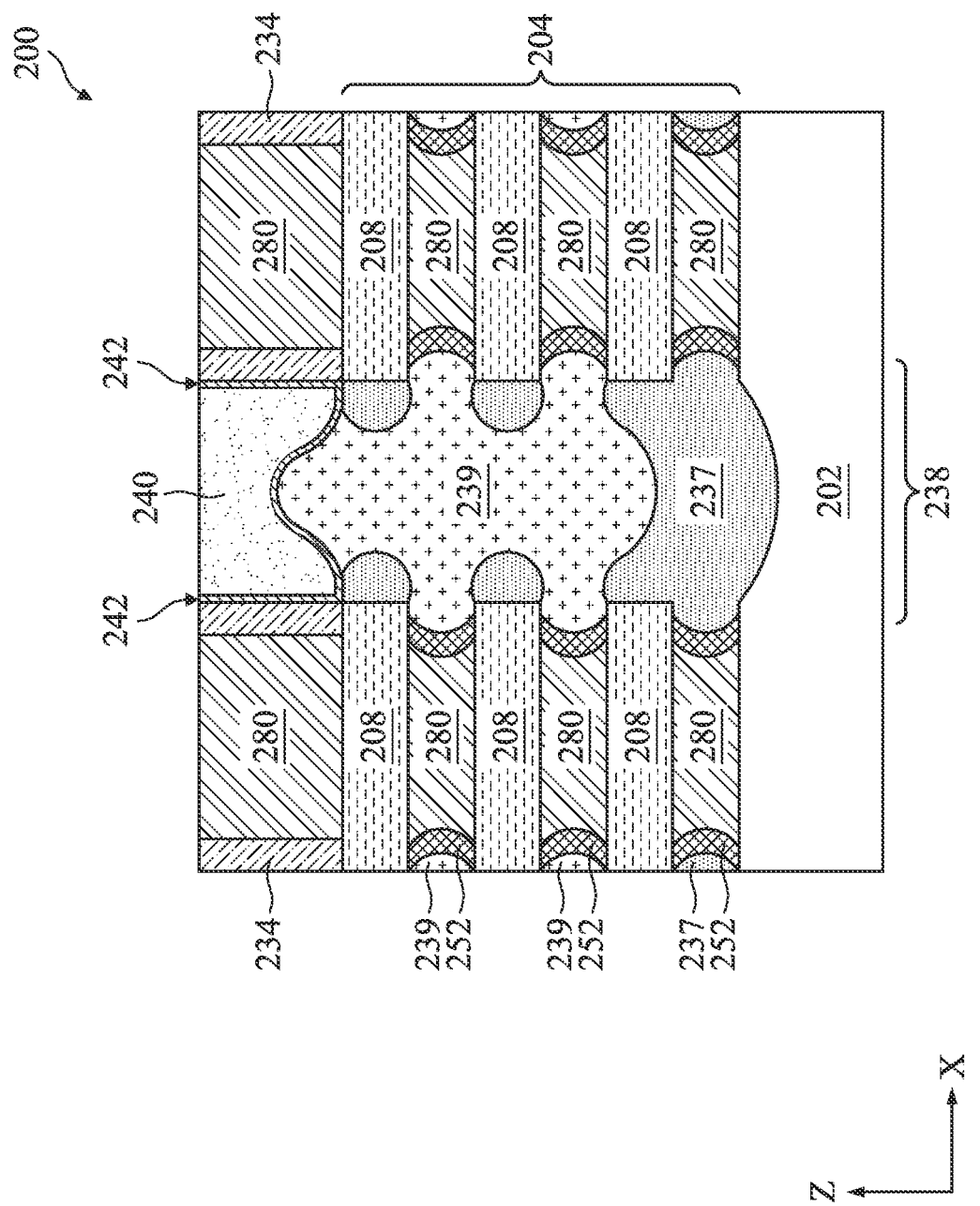
Figure 19B:
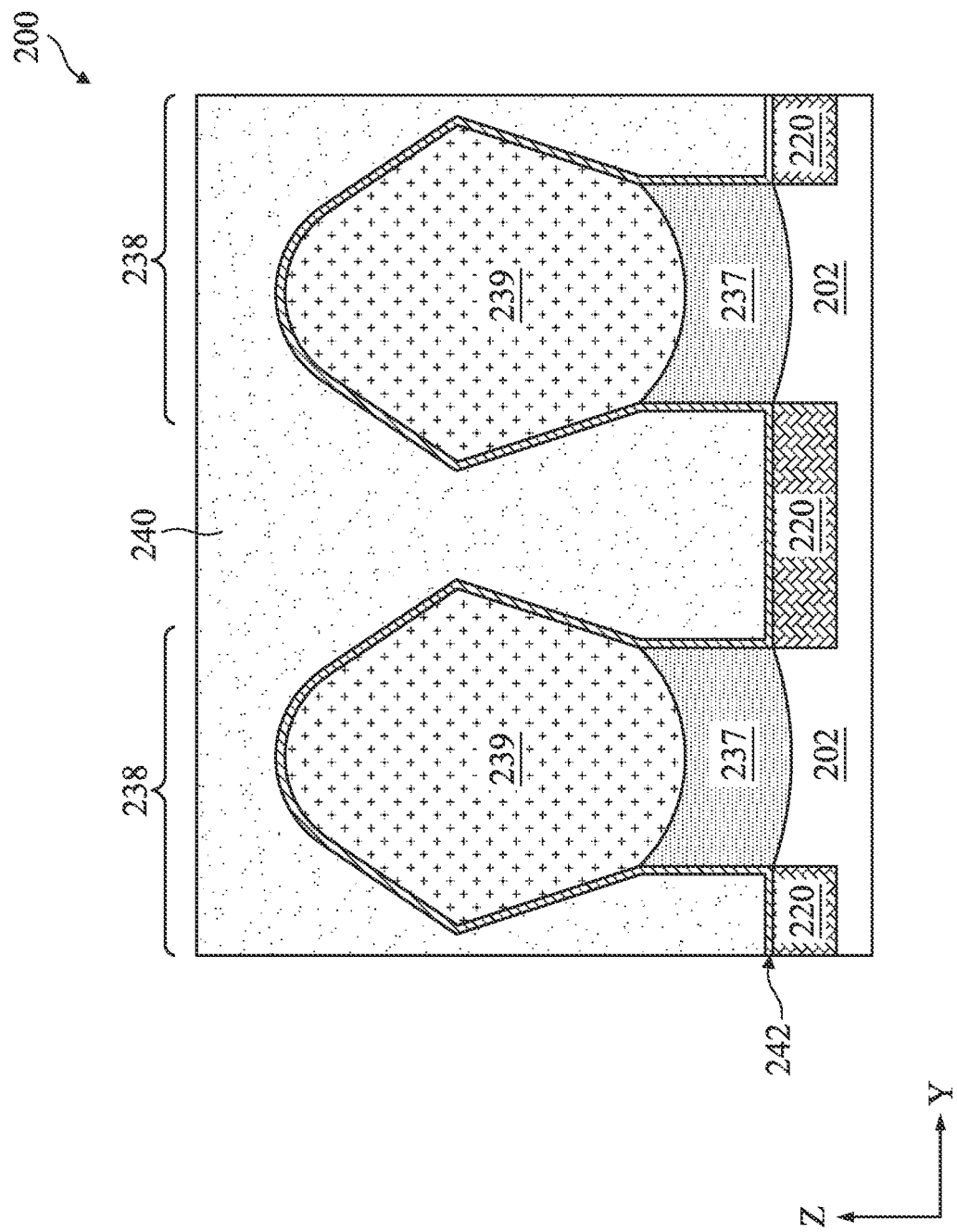

Referring to FIGS. 19A and 19B, the method 100 replaces the dummy gate stacks 226 and the epitaxial layers 206 with metal gate stacks 280 at operation 118. The replacement of the metal gate stacks 230 may include removing the dummy gate stacks 226 from the device 200 to form gate trenches (not depicted); removing the epitaxial layers 206 from the epitaxial stack 204 to form openings (not depicted) between the epitaxial layers 208 in a sheet formation, or sheet release, process, and forming metal gate stacks 280 in the gate trenches and the openings, such that the metal gate stacks 280 wraps around (or interleaved with) each epitaxial layer 208.

In the present embodiments, the metal gate stack 280 includes a gate dielectric layer (not depicted separately) and a metal gate electrode (not depicted separately) over the gate dielectric layer. The gate dielectric layer may include a high-k dielectric material, such as $HfO_2$, $La_2O_3$, other suitable materials, or combinations thereof. The metal gate electrode includes at least one work function metal layer and a bulk conductive layer disposed thereover. The work function metal layer may be a p-type or an n-type work function metal layer. Example work function metals include TiN, TaN, WN, $ZrSi_2$, $MoSi_2$, $TaSi_2$, $NiSi_2$, Ti, TaAl, TaAlC, TiAlN, TaC, TaCN, TaSiN, Mn, Zr, other suitable work function metals, or combinations thereof. The bulk conductive layer may include Cu, W, Al, Co, Ru, other suitable materials, or combinations thereof. The metal gate stack 280 may further include other material layers (not depicted), such as an interfacial layer disposed on surfaces of the epitaxial layers 208, a capping layer, a barrier layer, other suitable layers, or combinations thereof. Various layers of the metal gate stack 280 may be formed by various methods, including ALD, CVD, PVD, plating, other suitable methods, or combinations thereof. After forming the bulk conductive layer, one or more CMP processes are performed to remove excessive material formed on top surface of the ILD layer 240, thereby planarizing the device 200.

Figure 20A:
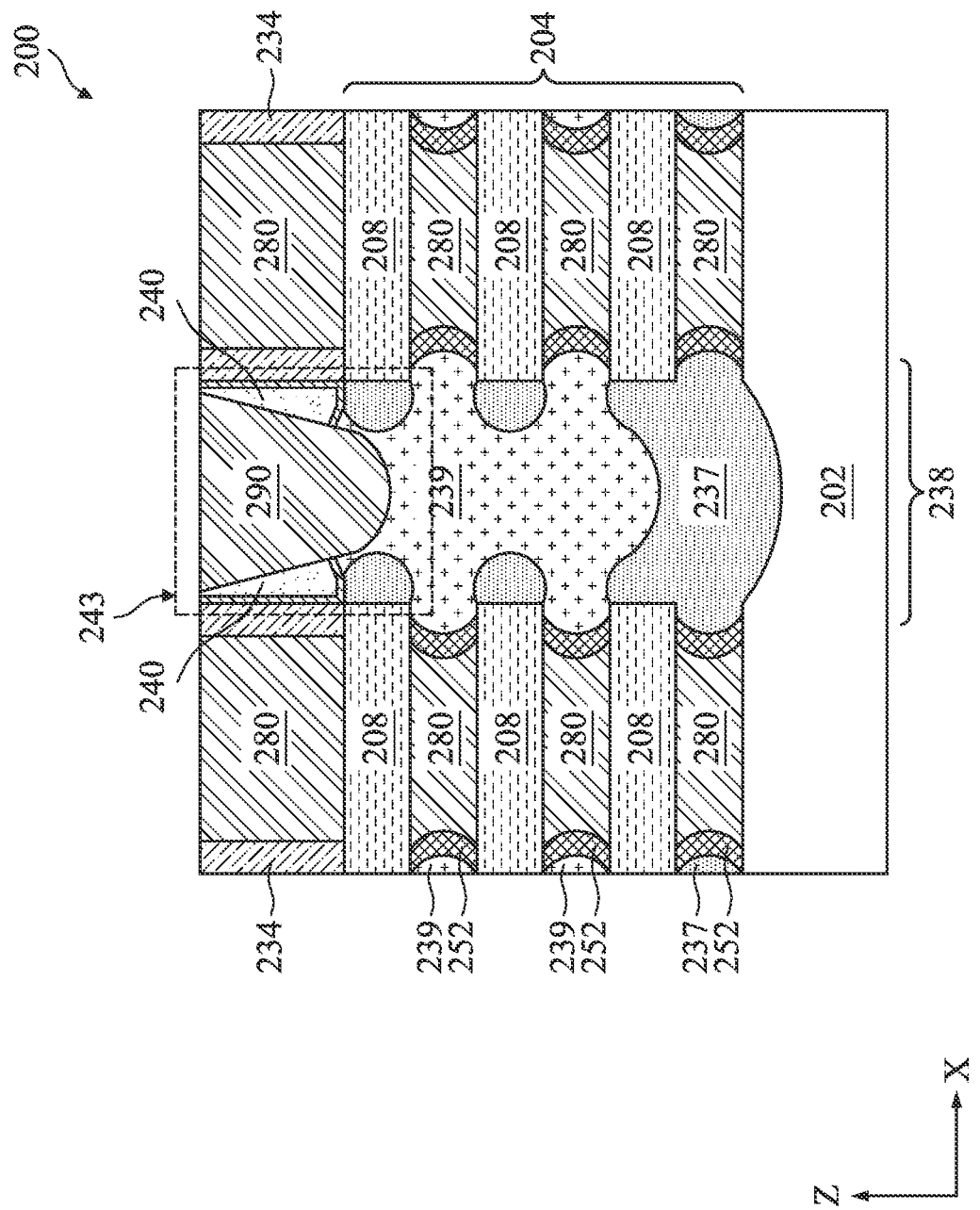
Figure 20B:
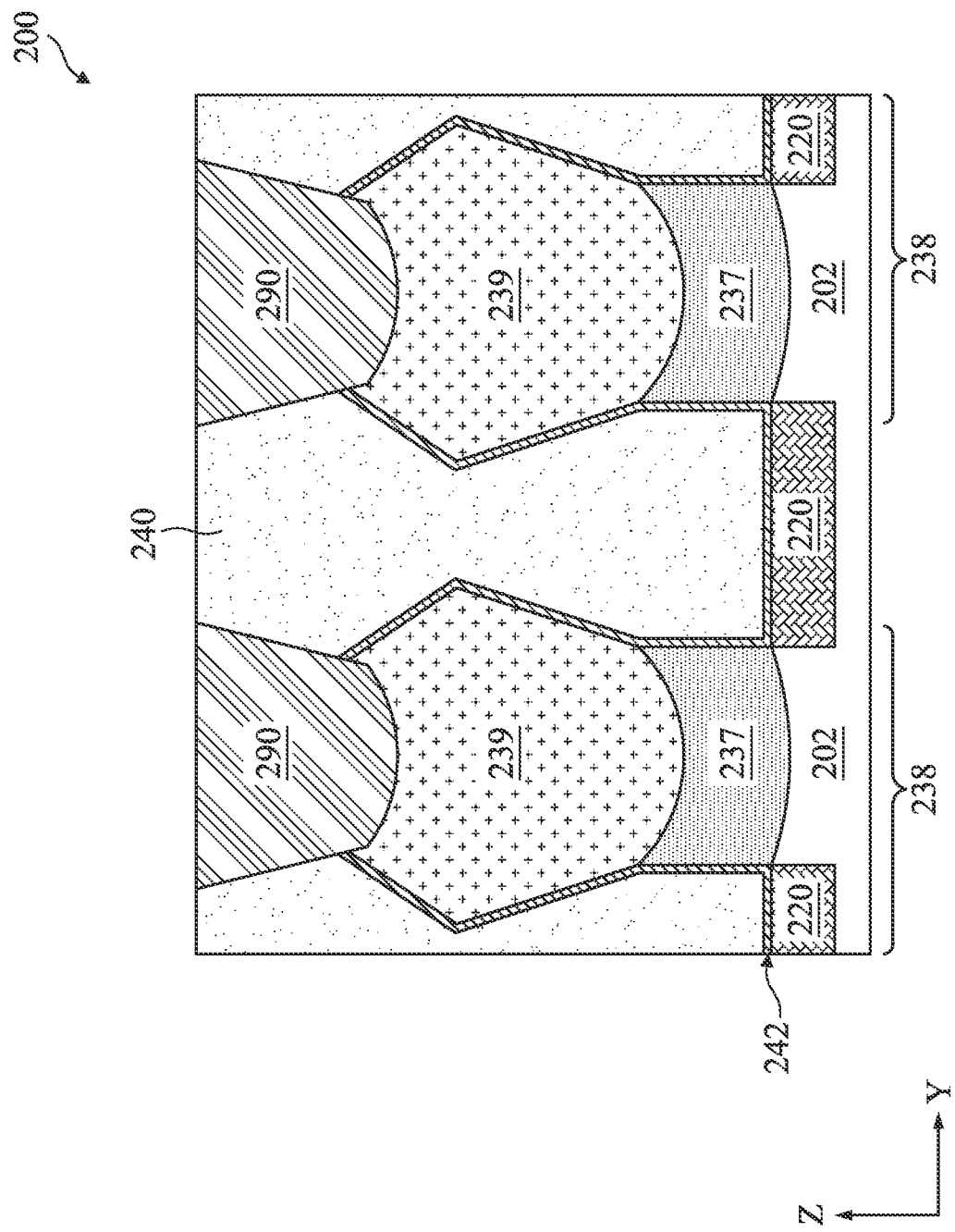

Thereafter, referring to FIGS. 1A, 20A and 20B, the method 100 forms S/D contact 290 over the S/D features 238 at operation 120. Each S/D contact 290 may include any suitable conductive material, such as Co, W, Ru, Cu, Al, Ti, Ni, Au, Pt, Pd, and/or other suitable conductive materials. The method 100 may form an S/D contact opening (or trench, not depicted) in the ILD layer 240 via a series of patterning and etching processes and subsequently deposit a conductive material in the S/D contact opening using any suitable method, such as CVD, ALD, PVD, plating, and/or other suitable processes. In some embodiments, a silicide layer (not depicted) is formed between the S/D features 238 and the S/D contact 290. The silicide layer may include nickel silicide, cobalt silicide, tungsten silicide, tantalum silicide, titanium silicide, platinum silicide, erbium silicide, palladium silicide, other suitable silicide, or combinations thereof. The silicide layer may be formed over the S/D feature 238 by a series of deposition, thermal, and etching processes. In the present embodiments, a bottom portion of the S/D contact 290 penetrates into the top portion of the S/D features 238.

Figure 20C:
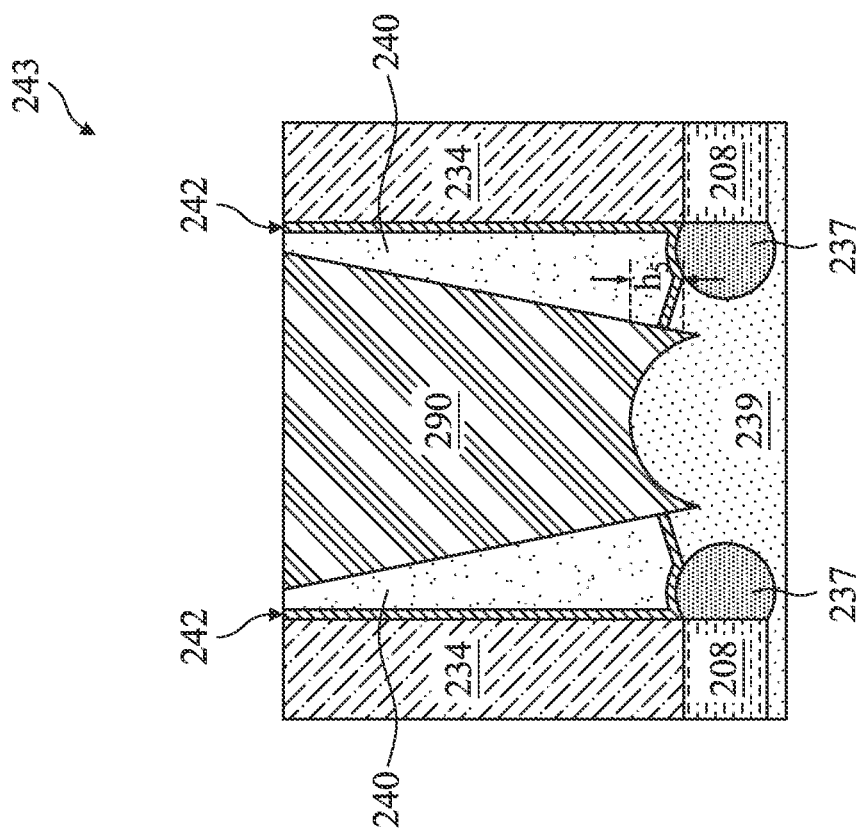
Figure 20D:
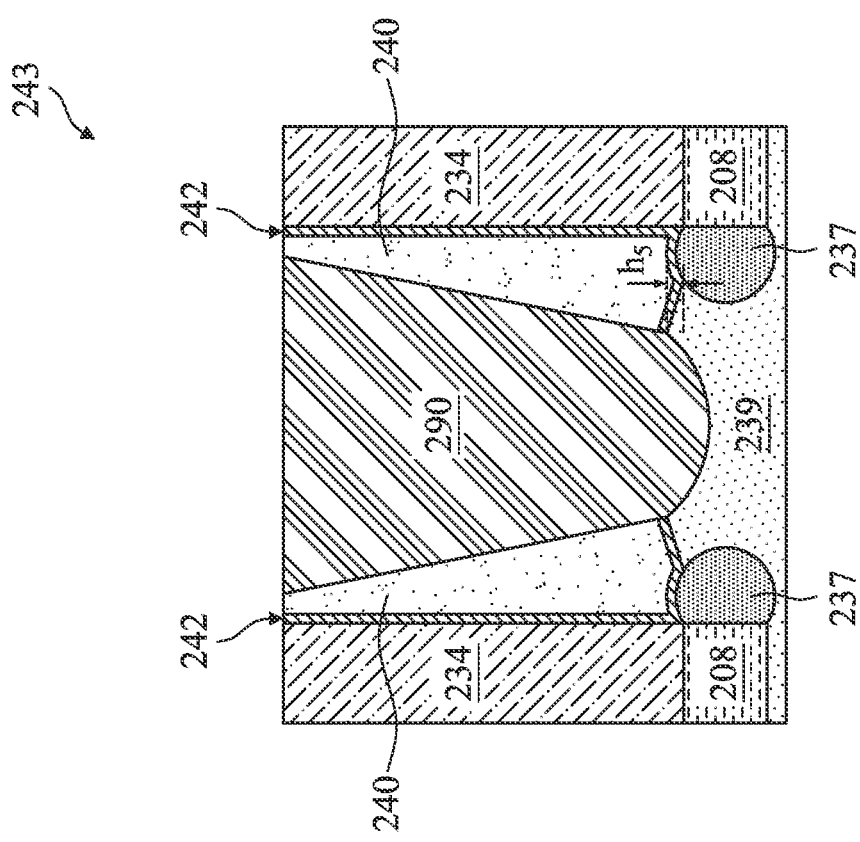

Referring to FIGS. 20C and 20D, a portion 243 of the device 200 as shown in FIG. 20A is enlarged to depict the various components after the forming of the S/D contact 290. The forming (landing) of the S/D contact 290 further reduced the height of the S/D feature 238. In the present embodiments, the height $h_5$ measured from the topmost point of the S/D contact to the fin top is less than the height $h_3$. In some examples, the height $h_5$ is about 1 nm to about 5 nm. The range of the height $h_5$ provides an advantageous tradeoff between contact resistance and parasitic capacitance. In the present embodiments, the S/D feature 238 is free of contact from the gate spacer 234 due to the modification prior to the forming of the S/D contact 290. In the present embodiments, the S/D feature 238 has a curved top surface including a first portion contours a bottom portion of the S/D contact 290 and a second portion (including the S/D layer 239 and the S/D layer 237) contoured by the CESL 242. A segment of the first portion, as well as the bottom portion of the S/D contact is below the fin top, while the second portion is above the fin top. In some examples, as depicted in FIG. 20C, the first portion is a concave shape with a middle point curves downwards (i.e., caves inwards to the S/D feature 238). In some alternative examples, as depicted in FIG. 20D, the first portion is a convex shape with the middle pint protruding upwards (i.e., bulging) into the bottom portion of the S/D contact 290.

Referring back to FIG. 1A, the method 100 at operation 122 performs additional processing steps to the device 200. For example, the additional fabrication steps to device 200 may include forming a multi-layer interconnect (MLI) structure (not depicted) thereover. The MLI may include various interconnect features, such as vias and conductive lines, disposed in dielectric layers, such as ESLs and ILD layers. In some embodiments, the vias are vertical interconnect features configured to interconnect a device-level contact, such as an S/D contact or a gate contact (not depicted), with a conductive line, or interconnect different conductive lines, which are horizontal interconnect features. The ESLs and the ILD layers of the MLI may have substantially the same compositions as those discussed above with respect to the CESL 242 and the ILD layer 240, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises TiN and/or TaN.

Although not intended to be limiting, one or more embodiments of the present disclosure provide many benefits to a semiconductor device and the formation thereof. For example, embodiments of the present disclosure provide an S/D feature modification method to reduce the parasitic capacitance and the S/D contact landing effect. The modification of the S/D feature is precisely controlled by alternating surface treatments and subsequent etching processes. The devices with modified S/D features demonstrated reduced parasitic capacitance without sacrificing other aspects of the device performance, such as the resistance. In addition, the method implements a patterning process during the modification to selectively modify chosen S/D features without affecting other S/D features.

In one aspect, the present disclosure provides a method includes providing a semiconductor structure including a fin protruding from a substrate, where the fin includes first semiconductor layers and second semiconductor layers, recessing the fin to form a source/drain (S/D) recess, forming an S/D feature in the S/D recess, trimming the S/D feature, depositing a dielectric layer to cover the S/D feature, forming a contact hole in the dielectric layer to expose the S/D feature, and forming a metal contact in the contact hole.

In another aspect, the present disclosure provides a method that alternately stacking first semiconductor layers and second semiconductors layers to form a semiconductor stack over a substrate, patterning the semiconductor stack to form a fin, forming a dummy gate stack over the fin, forming a source/drain (S/D) recess in the fin and adjacent to the dummy gate stack, epitaxially depositing an S/D feature in the S/D recess, treating a top portion of the S/D feature, removing the treated top portion of the S/D feature to form a reshaped S/D feature, depositing an interlayer dielectric (ILD) layer over the reshaped S/D feature, forming a contact hole in the ILD layer to expose the reshaped S/D feature, and forming a metal plug in the contact hole to contact the reshaped S/D feature.

In yet another aspect, the present disclosure provides a semiconductor structure that includes a semiconductor substrate, a fin including a stack of semiconductor layers disposed over the semiconductor substrate, a source/drain (S/D) feature adjacent to the fin, and an S/D contact landing on the S/D feature. The S/D feature has a curved top surface, where a first portion of the curved top surface is above a top surface of fin, and where a second portion of the curved top surface is below the top surface of the fin.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a semiconductor structure including a fin protruding from a substrate, wherein the fin includes first semiconductor layers and second semiconductor layers alternatingly disposed in a vertical direction, and wherein the first and second semiconductor layers include different material compositions;
   recessing the fin, thereby forming a source/drain (S/D) recess;
   forming an S/D feature in the S/D recess;
   trimming the S/D feature;
   depositing a dielectric layer to cover the S/D feature;
   forming a contact hole in the dielectric layer, thereby exposing a portion of the S/D feature; and
   depositing a metal material in the contact hole, thereby forming a metal contact landing on the S/D feature.

2. The method of claim 1, wherein the trimming of the S/D feature includes:
   treating a top surface of the S/D feature to change chemical properties of the top surface; and
   removing the treated top surface of the S/D feature.

3. The method of claim 2, wherein the treating of the top surface utilizes a plasma oxidation, a plasma nitridation, or a combination thereof, such that the top surface of the S/D feature is oxidized, nitridized, or a combination thereof, respectively.

4. The method of claim 1, wherein the trimming of the S/D feature reduces 30% to 50% of a height of a top portion of the S/D feature.

5. The method of claim 1, further comprising forming inner spacers on sidewalls of the second semiconductor layers exposed in the S/D recess, wherein the forming of the S/D feature includes:
   forming a first epitaxial layer in the S/D recess over the first semiconductor layers; and
   forming a second epitaxial layer over the first epitaxial layer to contact the inner spacers, thereby filling the S/D recess.

6. The method of claim 1, further comprising:
forming a replacement gate stack over the fin; and
forming a gate spacer on a sidewall of the replacement gate stack, wherein the forming of the S/D feature results in the S/D feature contacting the gate spacer.

7. The method of claim 6, wherein the trimming of the S/D feature results in a modified S/D feature free of contact from the gate spacer.

8. The method of claim 6, wherein the trimming of the S/D feature results in a modified S/D feature having a top portion above a top surface of fin, and wherein a height of the top portion is less than 10 nm.

9. A method, comprising:
alternately stacking first semiconductor layers and second semiconductors layers to form a semiconductor stack over a substrate, the first and second semiconductor layers having different material compositions;
patterning the semiconductor stack to form a fin;
forming a dummy gate stack over the fin;
forming a source/drain (S/D) recess in the fin and adjacent to the dummy gate stack;
epitaxially depositing an S/D feature in the S/D recess;
treating a top portion of the S/D feature;
removing the treated top portion of the S/D feature to form a reshaped S/D feature;
depositing an interlayer dielectric (ILD) layer over the reshaped S/D feature;
forming a contact hole in the ILD layer, thereby exposing the reshaped S/D feature; and
forming a metal plug in the contact hole to contact the reshaped S/D feature.

10. The method of claim 9, wherein the S/D recess is a first S/D recess and the S/D feature is a first S/D feature, and wherein the method further comprising:
forming a second S/D recess in the fin and adjacent to the dummy gate stack;
forming a second S/D feature in the second S/D recess, wherein the second S/D feature has a width wider than that of the first S/D feature, and wherein the second S/D feature has a height lower than that of the first S/D feature; and
covering the second S/D feature with a masking element prior to the treating of the top portion of the first S/D feature, thereby preventing the second S/D feature from being treated.

11. The method of claim 10, wherein the covering of the second S/D feature includes:
depositing the masking element over the substrate;
patterning the masking element to expose the first S/D feature; and
removing the patterned masking element after the removing of the treated top portion of the first S/D feature.

12. The method of claim 10, wherein the treating of the top portion of the first S/D feature includes performing a plurality of decoupled plasma (DP)-treating processes and a plurality of etching processes to the top portion of the first S/D feature, and wherein each of the DP-treating processes is followed by an etching process to remove the DP-treated top portion of the first S/D feature.

13. The method of claim 12, wherein each of the DP-treating processes treats a thickness of the top portion less than that of its proceeding DP-treating process.

14. The method of claim 12, wherein each of the plurality of etching processes employs milder etching conditions than those employed in its preceding etching process.

15. The method of claim 12, wherein the DP-treating processes includes decoupled plasma oxidation and/or decoupled plasma nitridation.

16. The method of claim 9, wherein the forming of the metal plug results in the top portion of the reshaped S/D feature penetrating into the metal plug.

17. A method, comprising:
forming a fin-shape structure protruding from a substrate;
forming a dummy gate stack over the fin-shape structure;
depositing a gate spacer layer on sidewalls of the dummy gate stack;
recessing a portion of the fin-shape structure to form a recess;
growing an epitaxial feature from the recess to reach a height such that the epitaxial feature is in direct contact with the gate spacer layer;
trimming the epitaxial feature in a cyclic process to reduce the height such that the epitaxial feature becomes free of contact with the gate space layer;
depositing a dielectric layer over the epitaxial feature; and
replacing the dummy gate stack with a metal gate stack.

18. The method of claim 17, wherein the cyclic process includes an oxidation process and an oxide removal process.

19. The method of claim 17, wherein the cyclic process includes a nitridation process and a nitride removal process.

20. The method of claim 17, further comprising:
forming a contact hole in the dielectric layer;
forming a contact feature in the contact hole, wherein the contact feature has a bottom surface bending upwardly, and wherein an edge of the bottom surface of the contact feature is below a top surface of the fin-shape structure.

* * * * *